(12) United States Patent
You

(10) Patent No.: US 12,295,225 B2
(45) Date of Patent: May 6, 2025

(54) DISPLAY DEVICE

(71) Applicant: Samsung Display Co., LTD., Yongin-si (KR)

(72) Inventor: Chungi You, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 449 days.

(21) Appl. No.: 17/720,716

(22) Filed: Apr. 14, 2022

(65) Prior Publication Data
US 2023/0015243 A1 Jan. 19, 2023

(30) Foreign Application Priority Data
Jul. 15, 2021 (KR) .................. 10-2021-0092920

(51) Int. Cl.
*H10D 86/00* (2025.01)
*H01L 23/00* (2006.01)
(Continued)

(52) U.S. Cl.
CPC ........... *H10K 59/131* (2023.02); *H01L 24/03* (2013.01); *H01L 24/05* (2013.01); *H10K 71/00* (2023.02); *H01L 24/06* (2013.01); *H01L 2224/03466* (2013.01); *H01L 2224/05018* (2013.01); *H01L 2224/05083* (2013.01); *H01L 2224/05086* (2013.01); *H01L 2224/05088* (2013.01); *H01L 2224/05097* (2013.01); *H01L 2224/05098* (2013.01); *H01L 2224/05124* (2013.01); *H01L 2224/05138* (2013.01); *H01L 2224/05139* (2013.01); *H01L 2224/05147* (2013.01); *H01L 2224/05155* (2013.01); *H01L 2224/05166* (2013.01); *H01L 2224/05169* (2013.01); *H01L 2224/05171* (2013.01); *H01L 2224/0518* (2013.01); *H01L 2224/05181* (2013.01); *H01L 2224/05184* (2013.01); *H01L 2224/05186* (2013.01); *H01L 2224/05558* (2013.01); *H01L 2224/05561* (2013.01); *H01L 2224/05573* (2013.01); *H01L 2224/05624* (2013.01);
(Continued)

(58) Field of Classification Search
None
See application file for complete search history.

(56) References Cited

U.S. PATENT DOCUMENTS

| | | | |
|---|---|---|---|
| 6,255,130 B1 * | 7/2001 | Kim ..................... | H10D 86/60 438/30 |
| 9,406,664 B2 * | 8/2016 | Chen ..................... | H10D 86/60 |

(Continued)

FOREIGN PATENT DOCUMENTS

| KR | 10-1084169 | 11/2011 |
|---|---|---|
| KR | 10-2020-0076938 | 6/2020 |

*Primary Examiner* — Bilkis Jahan
(74) *Attorney, Agent, or Firm* — KILE PARK REED & HOUTTEMAN PLLC

(57) ABSTRACT

A display device includes a substrate including a pad area, a first conductive pattern disposed in the pad area on the substrate, an insulating layer disposed on the first conductive pattern and overlapping the first conductive pattern, second conductive patterns disposed on the insulating layer, spaced apart from each other, and contacting the first conductive pattern through contact holes formed in the insulating layer, and a third conductive pattern disposed on the second conductive patterns and contacting the insulating layer.

18 Claims, 20 Drawing Sheets

(51) Int. Cl.
*H10K 59/131* (2023.01)
*H10K 71/00* (2023.01)
*H10K 59/12* (2023.01)

(52) U.S. Cl.
CPC ............ *H01L 2224/05638* (2013.01); *H01L 2224/05639* (2013.01); *H01L 2224/05647* (2013.01); *H01L 2224/05655* (2013.01); *H01L 2224/05666* (2013.01); *H01L 2224/05669* (2013.01); *H01L 2224/05671* (2013.01); *H01L 2224/0568* (2013.01); *H01L 2224/05681* (2013.01); *H01L 2224/05684* (2013.01); *H01L 2224/05686* (2013.01); *H01L 2224/06153* (2013.01); *H01L 2924/01021* (2013.01); *H01L 2924/0496* (2013.01); *H01L 2924/05032* (2013.01); *H01L 2924/0549* (2013.01); *H10K 59/1201* (2023.02)

(56) References Cited

U.S. PATENT DOCUMENTS

| | | | | |
|---|---|---|---|---|
| 2002/0039813 A1* | 4/2002 | Yamazaki | .......... | H10D 30/0314 438/151 |
| 2005/0030442 A1* | 2/2005 | Song | ................. | G02F 1/13458 349/43 |
| 2006/0238689 A1* | 10/2006 | Kim | ................. | G02F 1/136227 430/317 |
| 2007/0222936 A1* | 9/2007 | Shih | ................. | G02F 1/136286 349/187 |
| 2011/0080549 A1* | 4/2011 | Jung | ................... | G02F 1/1345 438/34 |
| 2019/0146293 A1* | 5/2019 | Xue | ...................... | H10D 86/60 257/72 |

* cited by examiner

DISPLAY DEVICE

This application claims priority to and benefits of Korean Patent Application No. 10-2021-0092920 under 35 U.S.C. § 119, filed on Jul. 15, 2021, in the Korean Intellectual Property Office, the content of which in its entirety is herein incorporated by reference.

BACKGROUND

1. Technical Field

The disclosure relates to a display device, more specifically, a display device which transmits and receives signals and/or voltages through pads included in the display device.

2. Discussion of the Related Art

A display device generally includes pixels and pads which are bonded to a circuit board (e.g., a driving chip or a flexible printed circuit board), and transmit signals and/or voltages to the pixels. As an adhesive (e.g., an anisotropic conductive film ("ACF")) is applied to the pads and pressure is applied to the pads and the circuit board, the pads may be bonded to the circuit board. In order to check whether the pads are properly bonded to the circuit board, an indentation inspection process and a rework process are performed. The indentation inspection process is a process of inspecting a position of the pressure and a magnitude of the pressure. The rework process is a process of removing the circuit board and cleaning the pads.

Shapes of the pads may be deformed during the rework process. For example, conductive patterns included in the pads may be pushed. The pushed conductive patterns may contact the adjacent pads, and as a result a short defect may occur between the pads.

SUMMARY

Embodiments are provided for a display device.

A display device according to an embodiment may include a substrate including a pad area, a first conductive pattern disposed in the pad area on the substrate, an insulating layer disposed on the first conductive pattern and overlapping the first conductive pattern, second conductive patterns disposed on the insulating layer, spaced apart from each other, and contacting the first conductive pattern through contact holes formed in the insulating layer, and a third conductive pattern disposed on the second conductive patterns and contacting the insulating layer.

According to an embodiment, each of the second conductive patterns may have an isolated shape.

According to an embodiment, the first conductive pattern may have a rectangular shape in a plan view, and the second conductive patterns may be arranged in a diagonal direction of the rectangular shape.

According to an embodiment, the contact holes may be arranged in the diagonal direction of the rectangular shape.

According to an embodiment, the second conductive patterns may contact the first conductive pattern through the contact holes.

According to an embodiment, the third conductive pattern may contact the second conductive patterns.

According to an embodiment, the second conductive patterns and the third conductive pattern may include a same material.

According to an embodiment, each of the second conductive patterns and the third conductive pattern may have a structure including titanium, aluminum, and titanium disposed in sequence.

According to an embodiment, the second conductive patterns and the first conductive pattern may include a different material.

According to an embodiment, the first conductive pattern may include molybdenum.

According to an embodiment, the insulating layer may include an overlap portion surrounding each of the contact holes and overlapping the first conductive pattern, and a non-overlap portion having an upper surface lower than an upper surface of the overlap portion in a thickness direction of the display device.

According to an embodiment, a thickness of the overlap portion may be a same as a thickness of the non-overlap portion.

According to an embodiment, a thickness of each of the overlap portion and the non-overlap portion may be about 6,000 angstroms to about 7,000 angstroms.

According to an embodiment, the display device may further include a fourth conductive pattern disposed on the third conductive pattern and directly contacting the third conductive pattern.

According to an embodiment, the display may further include an active pattern disposed in a display area adjacent to the pad area on the substrate, a gate electrode overlapping the active pattern, the gate electrode and the first conductive pattern being disposed in a same layer, a first connection electrode contacting the active pattern, the first connection electrode and the second conductive patterns being disposed in a same layer, a second connection electrode contacting the first connection electrode, the second connection electrode and the third conductive pattern being disposed in a same layer, a first electrode disposed on the second connection electrode and contacting the second connection electrode, an emission layer disposed on the first electrode, and a second electrode disposed on the emission layer.

A display device according to another embodiment may include a substrate including a pad area, a first conductive pattern disposed in the pad area on the substrate and including a first partial conductive pattern and a second partial conductive pattern which are defined by an opening, an insulating layer disposed on the first conductive pattern and contacting a side surface of the first partial conductive pattern adjacent to the opening and a side surface of the second partial conductive pattern adjacent to the opening, and a second conductive pattern disposed on the insulating layer and contacting the first conductive pattern through contact holes which are formed in the insulating layer.

According to an embodiment, the first partial conductive pattern and the second partial conductive pattern may be spaced apart from each other by the opening.

According to an embodiment, each of the first partial conductive pattern and the second partial conductive pattern may have a rectangular shape in a plan view, and the contact holes may be arranged in a diagonal direction of the rectangular shape.

Therefore, a display device according to embodiment may include multiple pads. Each of the pads may include a first conductive pattern and a second conductive pattern contacting the first conductive pattern through contact holes. A length (or area) of each of the contact holes may be significantly smaller than a length (or area) of the first conductive pattern. In other words, each of the second conductive patterns may be in point contact with the first conductive pattern. Accordingly, a stepped region existing on the upper surface of each of the second conductive patterns may be minimized, and each of the pads may have a substantially flat upper surface. Therefore, while the rework process is performed, the shapes of the pads may not be deformed, and a short defect between the pads may be prevented.

In addition, the contact holes may be arranged in the diagonal direction. Accordingly, the indentation inspection process can be easily performed. In other words, as the contact holes are arranged in the diagonal direction, the pressure applied to the terminals, the conductive balls, and the pads may be easily inspected.

In addition, the second conductive patterns may be spaced apart from each other and may be arranged in an island shape. Accordingly, in a region where the second conductive patterns are not disposed, monitoring during the indentation inspection process may be easily performed.

It is to be understood that both the foregoing general description and the following detailed description are examples and are intended to provide further explanation of the inventive concept as claimed.

BRIEF DESCRIPTION OF THE DRAWINGS

The accompanying drawings, which are included to provide a further understanding of the disclosure and constitute a part of this specification, illustrate embodiments of the invention.

DETAILED DESCRIPTION OF THE EMBODIMENTS

Figure 1:
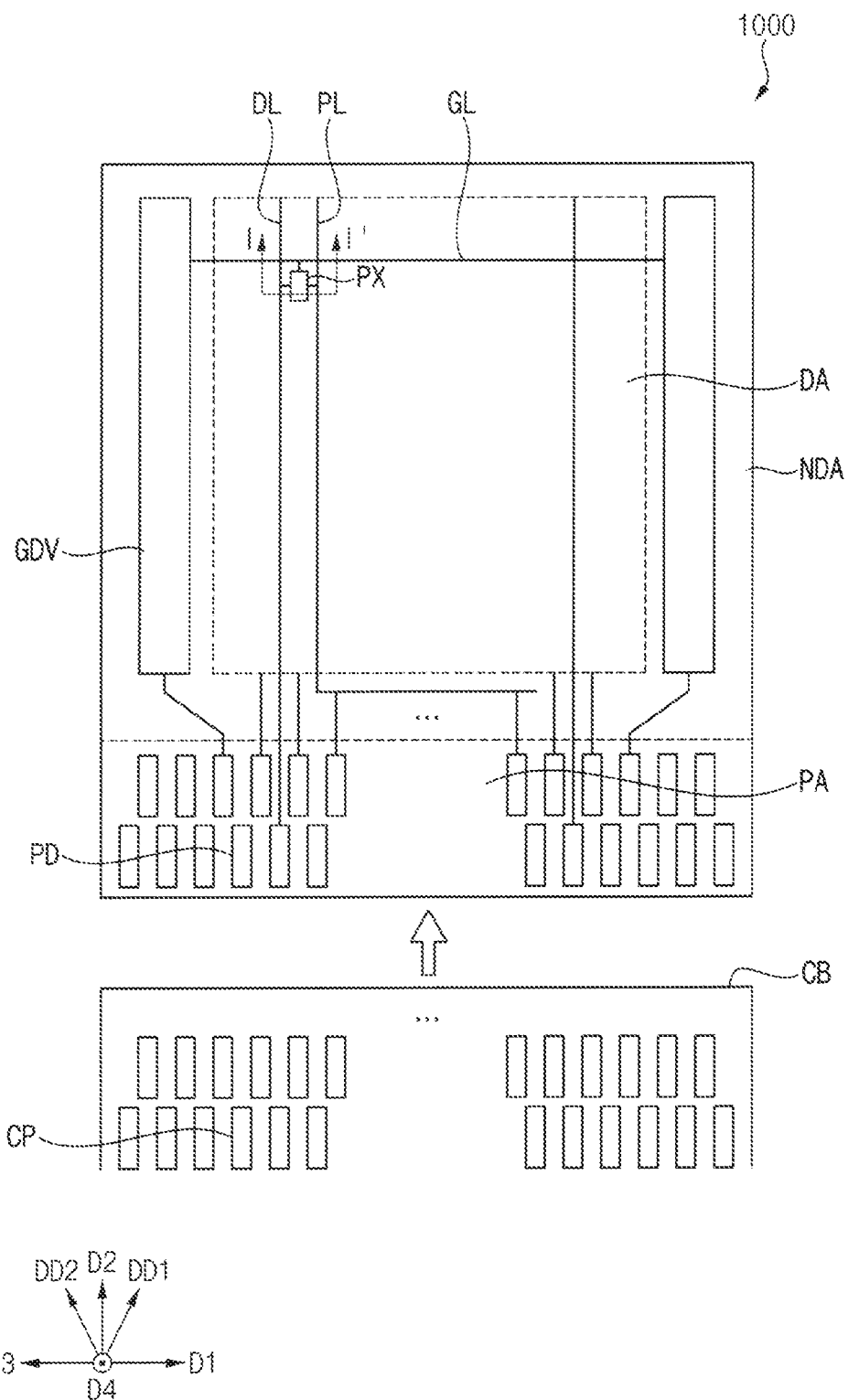
FIG. 1 is a plan view illustrating a display device according to an embodiment.

The disclosure now will be described more fully hereinafter with reference to the accompanying drawings, in which various embodiments are shown. This disclosure may, however, be embodied in many different forms, and should not be construed as limited to the embodiments set forth herein. Rather, these embodiments are provided so that this disclosure will be thorough and complete, and will fully convey the scope of the disclosure to those skilled in the art. Like reference numerals refer to like elements throughout. As used herein, a reference number may indicate a singular element or a plurality of the element. For example, a reference number labeling a singular form of an element within the drawing figures may be used to reference a plurality of the singular element within the text of specification.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

It will be understood that the terms "contact," "connected to," and "coupled to" may include a physical and/or electrical contact, connection, or coupling, and vice versa.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Illustrative, non-limiting embodiments will be more clearly understood from the following detailed description in conjunction with the accompanying drawings.

Figure 2:
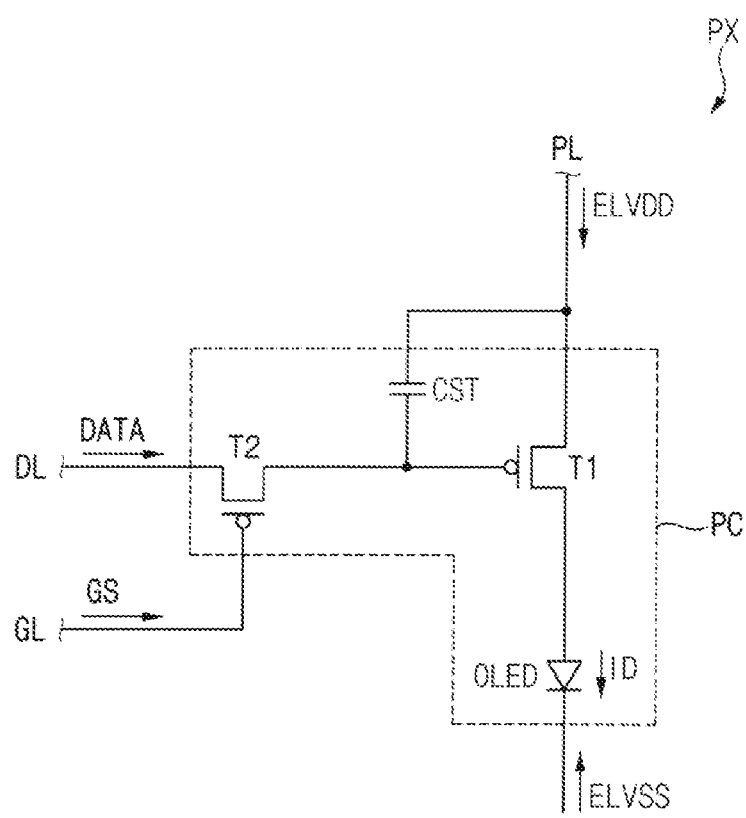
FIG. 2 is a circuit diagram illustrating a pixel included in the display device of FIG. 1.

FIG. 1 is a schematic plan view illustrating a display device according to an embodiment. FIG. 2 is a schematic diagram of an equivalent circuit illustrating a pixel included in the display device of FIG. 1.

Referring to FIG. 1, a display device 1000 according to an embodiment may be divided into a display area DA, a non-display area NDA, and a pad area PA. For example, the display area DA may have a rectangular shape, the non-display area NDA may be positioned to surround the display area DA, and the pad area PA may be disposed adjacent to the display area DA.

A pixel PX, a gate line GL, a data line DL, and a driving voltage line PL may be disposed in the display area DA of the display device 1000. For example, the gate line GL may extend in a first direction D1 and may transmit a gate signal GS to the pixel PX. The data line DL may extend in a second direction D2 perpendicular to the first direction D1 and may provide a data voltage DATA to the pixel PX. The driving voltage line PL may extend in the second direction D2 and may provide a driving voltage ELVDD to the pixel PX.

The data voltage DATA may be written in the pixel PX in response to the gate signal GS. The pixel PX may emit light having a luminance based on the data voltage DATA. As the pixel PX emits light, an image may be displayed in the display area DA.

A gate driver GDV and a common voltage line may be disposed in the non-display area NDA of the display device 1000. The gate driver GDV may be electrically connected to the gate line GL and pads PD. The gate driver GDV may receive a gate control signal and a clock signal from the pads PD and may generate the gate signal GS. The common voltage line may be electrically connected to the pads PD and a second electrode (e.g., a second electrode CTE in FIG. 4). The common voltage line may transfer a common voltage ELVSS from the pads PD to the second electrode CTE.

Referring to FIG. 2, a pixel circuit PC may include a first transistor T1, a second transistor T2, a storage capacitor CST, and an organic light emitting diode OLED.

The first transistor T1 may include a first terminal, a second terminal, and a gate terminal. The first terminal may receive the driving voltage ELVDD, the second terminal may be electrically connected to the organic light emitting diode OLED, and the gate terminal may be electrically connected to the second transistor T2. The first transistor T1 may generate a driving current ID based on the data voltage DATA.

The second transistor T2 may include a first terminal, a second terminal, and a gate terminal. The first terminal may receive the data voltage DATA, the second terminal may be electrically connected to the first transistor T1, and the gate terminal may receive the gate signal GS. The second transistor T2 may transmit the data voltage DATA in response to the gate signal GS.

The storage capacitor CST may include a first terminal and a second terminal. The first terminal may receive the driving voltage ELVDD, and the second terminal may be electrically connected to the first transistor T1. The data voltage DATA may be stored in the storage capacitor CST.

The organic light emitting diode OLED may include a first terminal and a second terminal. The first terminal may be electrically connected to the first transistor T1, and the second terminal may receive the common voltage ELVSS. The organic light emitting diode OLED may generate light based on the driving current ID.

However, the connection structure of the pixel circuit PC may not be limited to the above-described connection structure. In an embodiment, the pixel circuit PC may further include at least one transistor. For example, the pixel circuit PC may have a 3T1C structure, a 7T1C structure, a 7T2C structure, or the like.

Referring back to FIG. 1, pads PD may be disposed in the pad area PA of the display device 1000. For example, the pads PD may be arranged in (or along) the first direction D1 and may be spaced from each other in the second direction D2. However, the arrangement structure of the pads PD is not limited thereto.

In an embodiment, the pads PD may transmit signals and/or voltages from an external device to the display device 1000. For example, the pads PD may include a first pad, a second pad, a third pad, and a fourth pad. The first pad may be electrically connected to the gate driver GDV, the second pad may be electrically connected to the data line DL, the third pad may be electrically connected to the driving voltage line PL, and the fourth pad may be electrically connected to the common voltage line. However, the connection structure of the pads PD is not limited thereto.

In an embodiment, each of the pads PD may have a substantially same stacked structure. For example, each of the pads PD may have a structure in which conductive patterns are stacked each other. The conductive patterns may be formed together with the pixel PX.

In an embodiment, the pads PD may be electrically connected to a circuit board CB. For example, a data driver, a controller (e.g., a timing controller (T-CON)), and a power management circuit (e.g., a power management integrated circuit (PMIC)) may be disposed on the circuit board CB. The data driver may generate the data voltage DATA. The controller may control the gate driver, the data driver, the power management circuit, and the like. The power management circuit may provide power required to drive the display device 1000. In an embodiment, terminals CP may be formed on the circuit board CB. The positions where the terminals CP are formed may correspond to positions where the pads PD are formed. The circuit board CB may be bonded to the pad area PA so that the terminals CP contact the pads PD. For example, by a bonding process, the circuit board CB may be bonded to the pad area PA using an anisotropic conductive film (ACF). The anisotropic conductive film (ACF) may include conductive balls. The conductive balls may be disposed between the pads PD and the terminals CP. As the conductive balls have conductivity, the pads PD and the terminals CP corresponding to each other may be electrically connected to each other.

The circuit board CB may be a driving chip or a flexible printed circuit board. For example, in case that the display device 1000 has a chip on glass (COG) structure or a chip on plastic (COP) structure, the circuit board CB may be the driving chip. In case that the display device 1000 has a chip on film (COF) structure, the circuit board CB may be the flexible printed circuit board. However, the circuit board CB is not limited thereto.

After the bonding process, an indentation inspection process and a rework process may be performed. The indentation inspection process may be a process of monitoring the pads PD to inspect the position and magnitude of the pressure applied to the pad area PA. The pressure applied to the terminals CP, the conductive balls, and the pads PD may be inspected by the indentation inspection process. Accordingly, it may be inspected whether the pads PD are normally electrically connected to the terminals CP. The rework process may be a process of removing the circuit board CB and cleaning the pads PD. For example, in case that the pads PD are not normally electrically connected to the terminals CP, the circuit board CB may be removed from the pad area PD. Foreign substances (e.g., the conductive balls) remaining on the pads PD may be removed.

As the display device 1000 according to embodiments includes the pads PD, the monitoring during the indentation inspection process may be easily performed, and a short circuit between the pads PD occurring during the rework process may be prevented.

Figure 3:
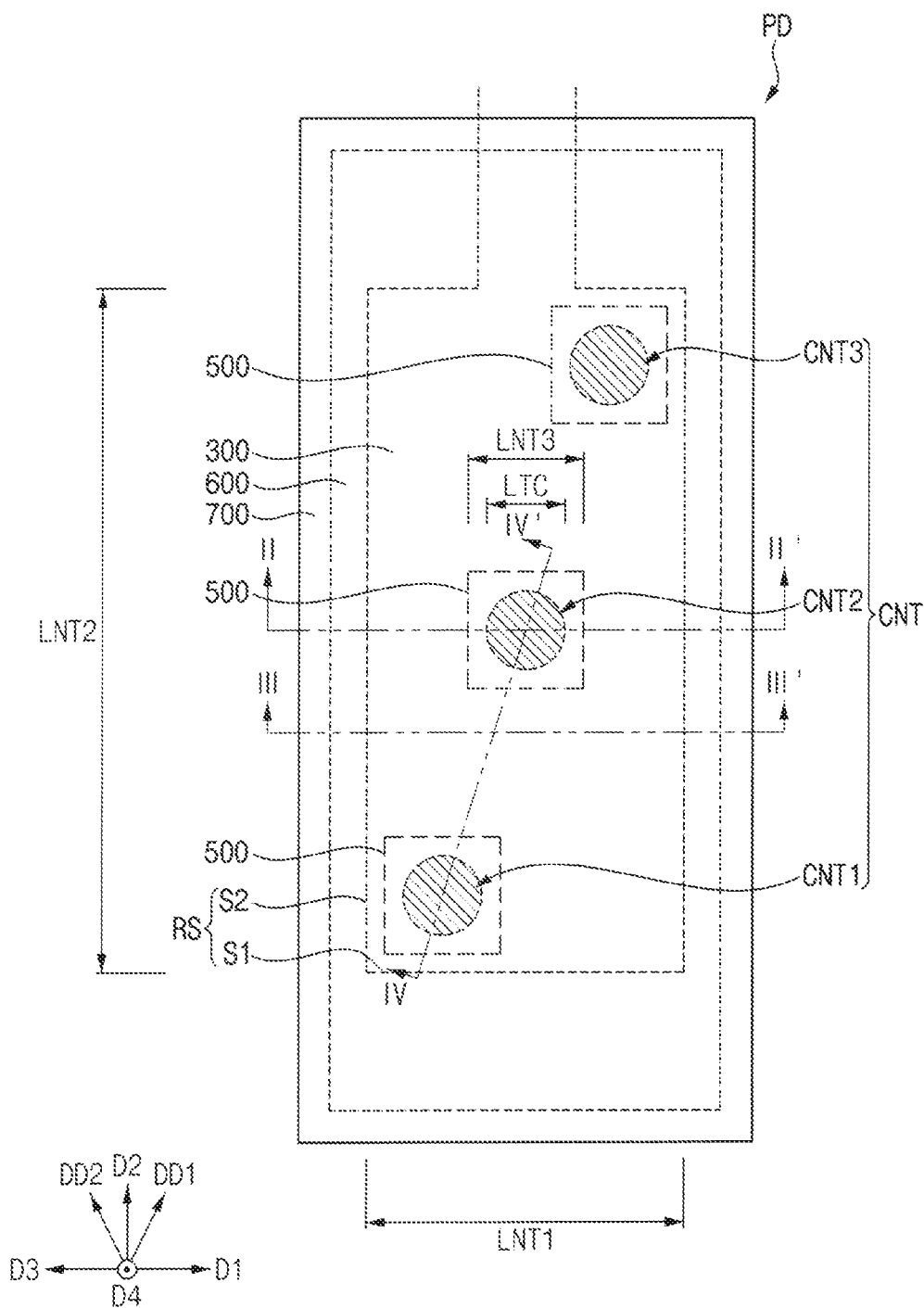
FIG. 3 is a plan view illustrating a pad included in the display device of FIG. 1.
Figure 4:
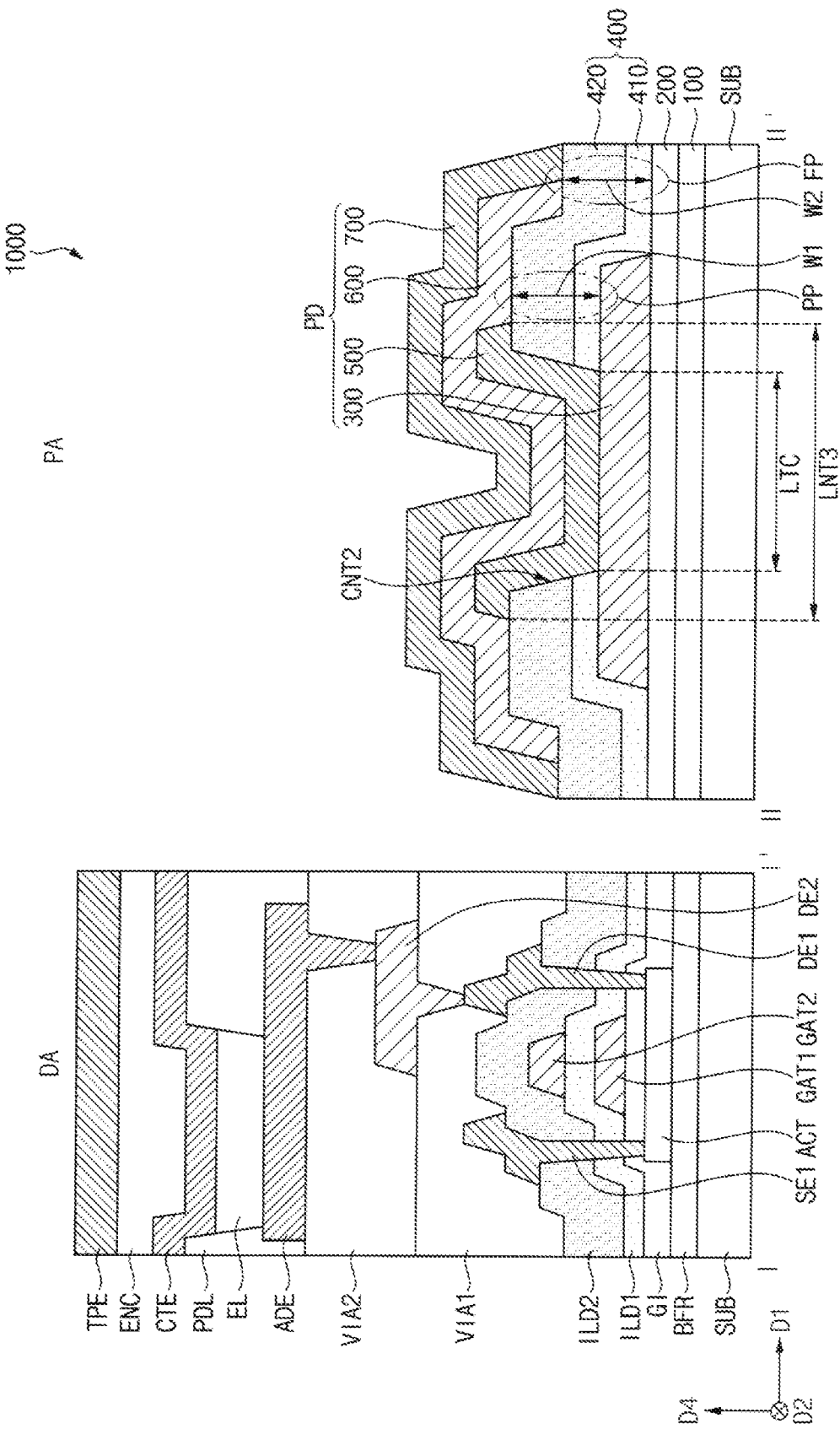
FIG. 4, FIG. 5, and FIG. 6 are cross-sectional views illustrating the display device of FIG. 1.
Figure 5:
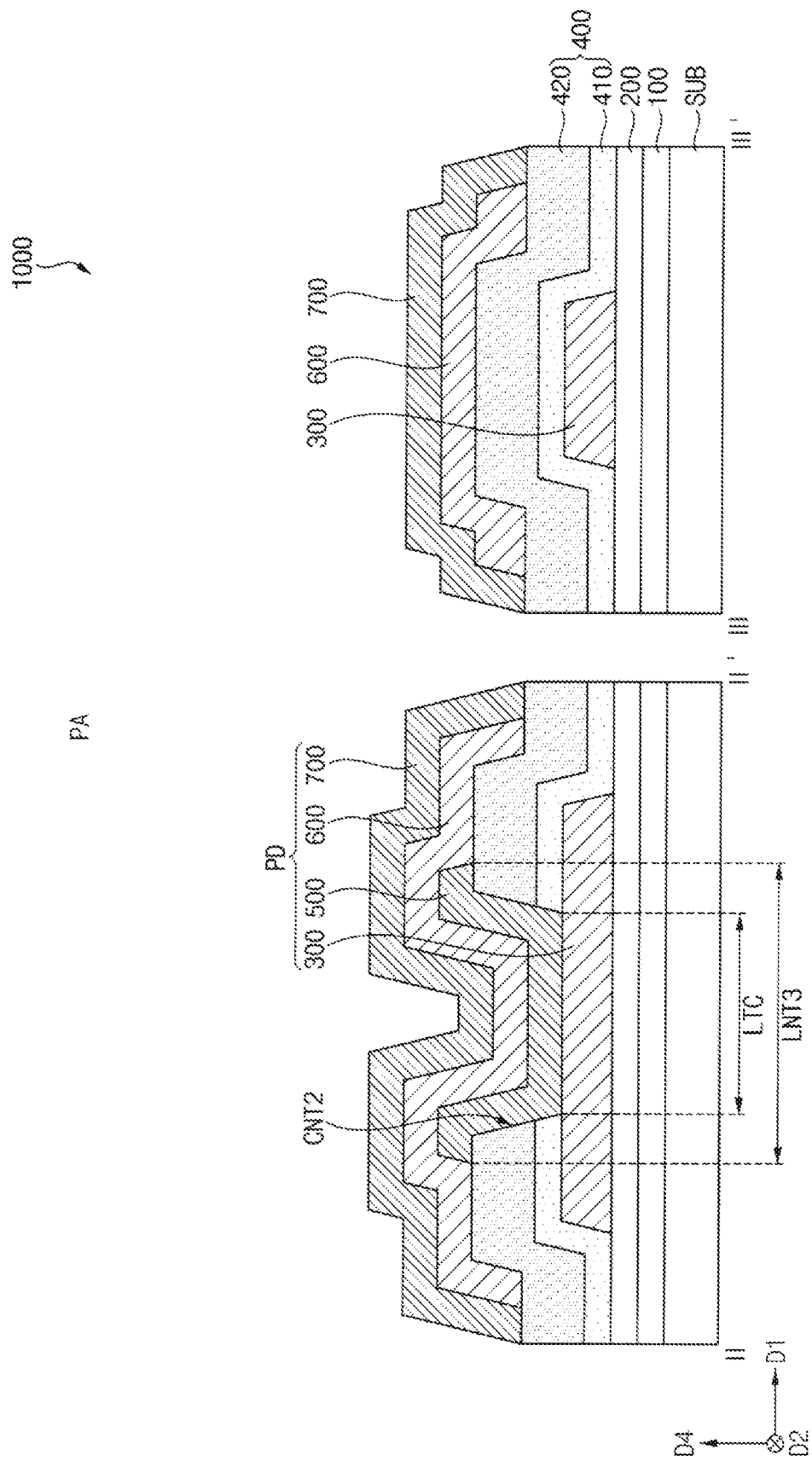
Figure 6:
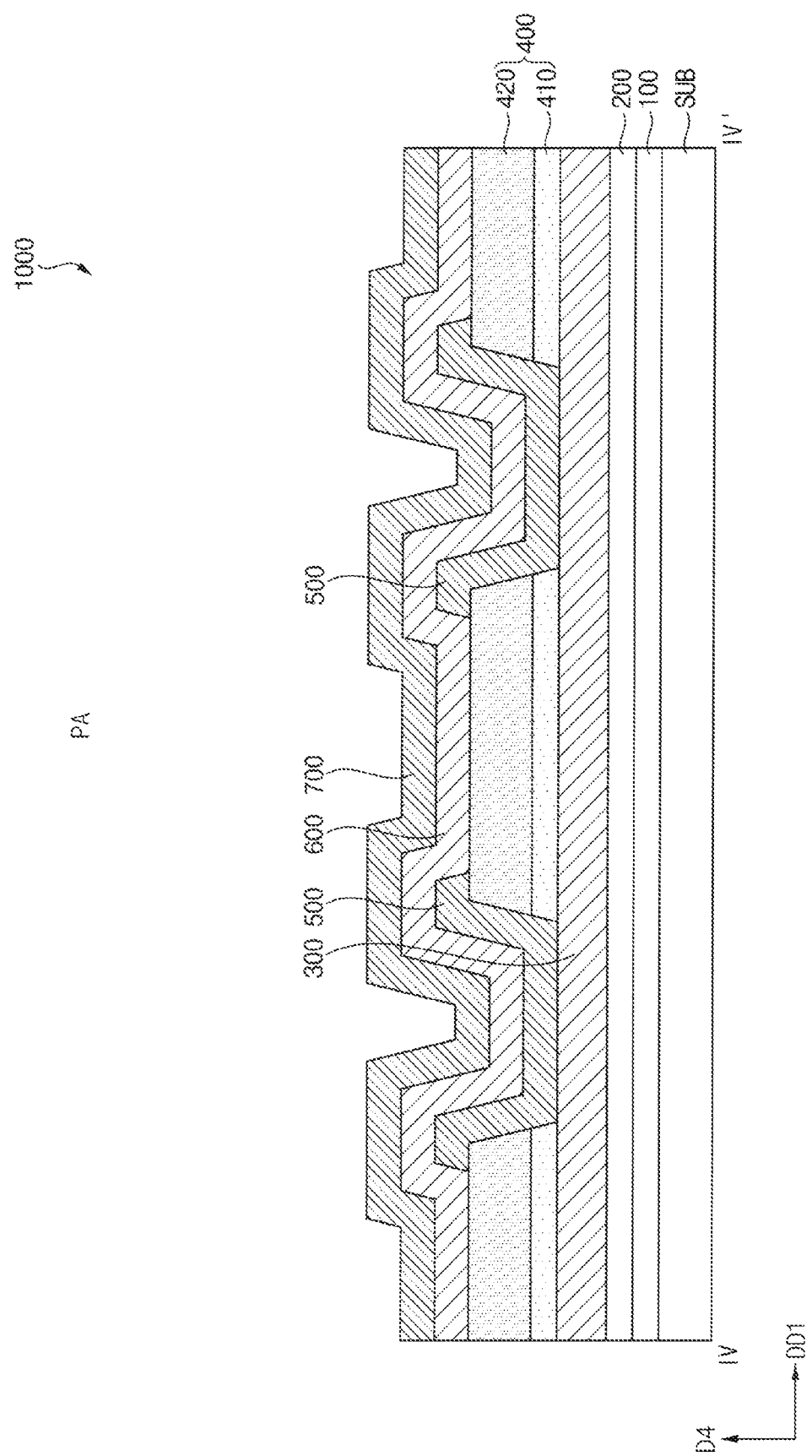

FIG. 3 is a schematic plan view illustrating a pad included in the display device of FIG. 1. FIGS. 4 to 6 are schematic cross-sectional views illustrating the display device of FIG. 1. For example, FIG. 4 illustrates a first cross-sectional view taken along line I-I' of FIG. 1 and a second cross-sectional view taken along line II-IF of FIG. 3, FIG. 5 illustrates the second cross-sectional view and a third cross-sectional view taken along line of FIG. 3, and FIG. 6 illustrates a fourth cross-sectional view taken along line IV-IV' of FIG. 3.

Referring to FIGS. 3 and 4, a substrate SUB may include the display area DA and the pad area PA. The substrate SUB may be formed of a transparent or opaque material. Examples of materials that can be used as the substrate SUB may include glass, quartz, plastic, and the like. These may be used alone or in combination with each other.

A buffer layer BFR may be disposed on the substrate SUB and may overlap the display area DA. In an embodiment, the buffer layer BFR may include an inorganic material. Examples of materials that can be used as the buffer layer BFR may include silicon oxide, silicon nitride, silicon oxynitride, and the like. These may be used alone or in combination with each other. The buffer layer BFR may prevent diffusion of metal atoms or impurities from the substrate SUB to an active pattern ACT. The buffer layer BFR may control a heat supply rate during a crystallization process for forming the active pattern ACT.

The active pattern ACT may be disposed on the buffer layer BFR and may overlap the display area DA. In an embodiment, the active pattern ACT may include a silicon semiconductor or an oxide semiconductor. Examples of materials that can be used as the active pattern ACT may include amorphous silicon, polycrystalline silicon, metal oxide, and the like. These may be used alone or in combination with each other.

A gate insulating layer GI may cover the active pattern ACT and may overlap the display area DA. In an embodiment, the gate insulating layer GI may include an inorganic insulating material. Examples of materials that may be used as the gate insulating layer GI may include silicon oxide, silicon nitride, silicon oxynitride, and the like. These may be used alone or in combination with each other.

A first gate electrode GAT1 may be disposed on the gate insulating layer GI and may overlap the active pattern ACT. In an embodiment, the first gate electrode GAT1 may include a metal, an alloy, a conductive metal oxide, a transparent conductive material, or the like. Examples of materials that can be used as the first gate electrode GAT1 may be silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other. The first gate electrode GAT1 may form the first transistor T1 together with the active pattern ACT.

A first interlayer insulating layer ILD1 may cover the first gate electrode GAT1 and may overlap the display area DA. In an embodiment, the first interlayer insulating layer ILD1 may include an inorganic insulating material. Examples of materials that can be used as the first interlayer insulating layer ILD1 may be silicon oxide, silicon nitride, silicon oxynitride, and the like. These may be used alone or in combination with each other.

A second gate electrode GAT2 may be disposed on the first interlayer insulating layer ILD1 and may overlap the first gate electrode GAT1. In an embodiment, the second gate electrode GAT2 may include a metal, an alloy, a conductive metal oxide, a transparent conductive material, or the like. For example, the second gate electrode GAT2 and the first gate electrode GAT1 may include a same material. The second gate electrode GAT2 may form the storage capacitor CST together with the first gate electrode GAT1.

A second interlayer insulating layer ILD2 may cover the second gate electrode GAT2 and may overlap the display area DA. In an embodiment, the second interlayer insulating layer ILD2 may include an inorganic insulating material. Examples of materials that can be used as the second interlayer insulating layer ILD2 may be silicon oxide, silicon nitride, silicon oxynitride, and the like. These may be used alone or in combination with each other.

A first source electrode SE1 and a first drain electrode DE1 may be disposed on the second interlayer insulating layer ILD2 and may contact the active pattern ACT. In an embodiment, the first source electrode SE1 and the first drain electrode DE1 may include a metal, an alloy, a conductive metal oxide, a transparent conductive material, or the like. For example, the first source electrode SE1 and the first drain electrode DE1 may have a Ti/Al/Ti structure or a structure including titanium (Ti), aluminum (Al), and titanium (Ti) disposed in sequence.

A first via insulating layer VIA1 may cover the first source electrode SE1 and the first drain electrode DE1 and may overlap the display area DA. In an embodiment, the first via insulating layer VIA1 may include an organic insulating material. Examples of materials that can be used as the first via insulating layer VIA1 may be photoresist, polyacrylic resin, polyimide resin, acrylic resin, and the like. These may be used alone or in combination with each other.

A second drain electrode DE2 may be disposed on the first via insulating layer VIA1 and may contact the first drain electrode DE1. In an embodiment, the second drain electrode DE2 may include a metal, an alloy, a conductive metal oxide, a transparent conductive material, or the like. For example, the second drain electrode DE2 may have a Ti/Al/Ti structure.

A second via insulating layer VIA2 may cover the second drain electrode DE2 and may overlap the display area DA. In an embodiment, the second via insulating layer VIA2 may include an organic insulating material.

A first electrode ADE may be disposed on the second via insulating layer VIA2 and may contact the second drain electrode DE2. In an embodiment, the first electrode ADE may include a metal, an alloy, a conductive metal oxide, a transparent conductive material, or the like. Examples of materials that can be used as the first electrode ADE may be silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other. In an embodiment, the first electrode ADE may have an ITO/Ag/ITO structure or a structure including indium tin oxide (ITO), silver (Ag), and indium tin oxide (ITO) disposed in sequence.

A pixel defining layer PDL may be disposed on the second via insulating layer VIA2 and/or the first electrode ADE and may overlap the display area DA. In an embodiment, the pixel defining layer PDL may include an organic insulating material. An opening exposing an upper surface of the first electrode ADE may be formed in the pixel defining layer PDL.

An emission layer EL may be disposed in the opening. The emission layer EL may generate light based on the driving current ID. For example, the light emitting layer EL may include an organic light emitting material.

The second electrode CTE may be disposed on the emission layer EL. In an embodiment, the second electrode CTE may include a metal, an alloy, a conductive metal oxide, a transparent conductive material, or the like. The first electrode ADE, the emission layer EL, and the second electrode CTE may constitute the organic light emitting diode OLED.

A light emitting diode included in the display device 1000 may not be limited to the organic light emitting diode. For example, the LED may include at least one of a micro light emitting diode, a nano light emitting diode, a quantum dot (QD), and a quantum rod (QR).

An encapsulation layer ENC may be disposed on the second electrode CTE. The encapsulation layer ENC may include an insulating material. In an embodiment, the encapsulation layer ENC may be an encapsulation substrate. For example, the encapsulation layer ENC may be a glass substrate, a plastic substrate, or an encapsulation film. In an embodiment, the encapsulation layer ENC may have a structure in which inorganic layers and organic layers are alternately stacked each other. The encapsulation layer ENC may prevent foreign matter from permeating into the emission layer EL.

A sensing electrode TPE may be disposed on the encapsulation layer ENC. In an embodiment, the sensing electrode TPE may include a metal, an alloy, a conductive metal oxide, a transparent conductive material, or the like. For example, the sensing electrode TPE may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. The sensing electrode TPE may form a capacitance, and a user's touch may be sensed based on an amount of change in the capacitance.

As shown in FIG. 4, a first lower insulating layer 100 may be disposed on the substrate SUB and may overlap the pad area PA. In an embodiment, the first lower insulating layer 100 may include an inorganic material. For example, the first lower insulating layer 100 may include silicon oxide, silicon nitride, silicon oxynitride, or the like. In an embodiment, the first lower insulating layer 100 may be formed together with the buffer layer BFR.

A second lower insulating layer 200 may be disposed on the first lower insulating layer 100 and may overlap the pad area PA. In an embodiment, the second lower insulating layer 200 may include an inorganic material. The second lower insulating layer 200 may be formed together with the gate insulating layer GI.

As shown in FIGS. 3 and 4, the pads PD may be disposed on the second lower insulating layer 200 and may overlap the pad area PA. Each of the pads PD may include a first conductive pattern 300, second conductive patterns 500, a third conductive pattern 600, and a fourth conductive pattern 700.

The first conductive pattern 300 may be disposed on the second lower insulating layer 200 and may overlap the pad area PA. In an embodiment, the first conductive pattern 300 may include a metal, an alloy, a conductive metal oxide, a transparent conductive material, or the like. Examples of materials that can be used as the first conductive pattern 300 may be silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. For example, the first conductive pattern 300 may be formed together with the first gate electrode GAT1.

In an embodiment, as shown in FIG. 3, the first conductive pattern 300 may have a rectangular shape RS. The rectangular shape RS may include a first side S1 extending in the first direction D1 and a second side S2 extending in the second direction D2. For example, a first length LNT1 of the first side S1 may be smaller than a second length LNT2 of the second side S2. The first length LNT1 may be about 10 μm to about 20 μm, and the second length LNT2 may be about 50 μm to about 150 μm.

An insulating layer 400 may cover the first conductive pattern 300 and may overlap the pad area PA. The insulating layer 400 may include a first insulating layer 410 and a second insulating layer 420.

The first insulating layer 410 may cover the first conductive pattern 300 and may overlap the pad area PA. In an embodiment, the first insulating layer 410 may include an inorganic insulating material. Examples of materials that can be used as the first insulating layer 410 may be silicon oxide, silicon nitride, silicon oxynitride, and the like. For example, the first insulating layer 410 may be formed together with the first interlayer insulating layer ILD1.

The second insulating layer 420 may contact the first insulating layer 410 and may overlap the pad area PA. In an embodiment, the second insulating layer 420 may include an inorganic insulating material. Examples of materials that can be used as the second insulating layer 420 may be silicon oxide, silicon nitride, silicon oxynitride, and the like. For example, the second insulating layer 420 may be formed together with the second interlayer insulating layer ILD2.

In an embodiment, as shown in FIG. 3, contact holes CNT may be formed in the first insulating layer 410 and the second insulating layer 420. In other words, the contact holes CNT may pass through the first insulating layer 410 and the second insulating layer 420. Accordingly, the contact holes CNT may expose an upper surface of the first conductive pattern 300.

In an embodiment, the contact holes CNT may include a first contact hole CNT1, a second contact hole CNT2, and a third contact hole CNT3. The first contact hole CNT1, the second contact hole CNT2, and the third contact hole CNT3 may be arranged in (or along) a diagonal direction of the rectangular shape RS. In detail, the first contact hole CNT1, the second contact hole CNT2, and the third contact hole CNT3 may be arranged in (or along) a first diagonal direction DD1 between the first direction D1 and the second direction D2.

In an embodiment, the first length LNT1 may be greater than a length LTC of each of the contact holes CNT. For example, the first length LNT1 may be about three times greater than the length LTC of each of the contact holes CNT. The first length LNT1 may be greater than about 9 μm, and the length LTC of each of the contact holes CNT may be less than about 3 μm. In an embodiment, a planar area of each of the contact holes CNT may be less than about 7 μm².

In an embodiment, as shown in FIG. 4, the first insulating layer 410 and the second insulating layer 420 may include an overlap portion PP and a non-overlap portion FP. The overlap portion PP may surround the contact holes CNT and may overlap the first conductive pattern 300. The non-overlap portion FP may be disposed lower than the overlap portion PP. A first thickness W1 of the overlap portion PP in a thickness direction (e.g., a fourth direction D4) may be the same as a second thickness W2 of the non-overlap portion FP in the fourth direction D4. The fourth direction D4 may be a direction perpendicular to a plane defined by the first direction D1 and the second direction D2. For example, the first thickness W1 and the second thickness W2 may be about 6,000 angstroms to about 7,000 angstroms. A thickness of the first insulating layer 410 may be about 1,400 angstroms, and a thickness of the second insulating layer 420 may be about 5,000 angstroms.

Referring to FIGS. 3 and 5, the second conductive patterns 500 may be disposed on the second insulating layer 420 and may overlap the pad area PA. In an embodiment, the second conductive patterns 500 may include a metal, an alloy, a conductive metal oxide, a transparent conductive material, or the like. A material included in the second conductive patterns 500 may be different from a material included in the first conductive pattern 300. For example, the second conductive patterns 500 may be formed together with the first source electrode SE1 and may have a Ti/Al/Ti structure.

Referring to FIGS. 3, 5, and 6, the second conductive patterns 500 may be spaced from each other. For example, the second conductive patterns 500 may be arranged in an isolated or island shape. Each of the second conductive patterns 500 may have an isolated shape. The second conductive patterns 500 may be arranged in (or along) the first diagonal direction DD1 of the rectangular shape RS to cover the first to third contact holes CNT1, CNT2, and CNT3, respectively. However, the positions where the second conductive patterns 500 are arranged are not limited thereto.

In an embodiment, the second conductive patterns 500 may contact the first conductive pattern 300 through the contact holes CNT1, CNT2, and CNT3, respectively. In other words, each second conductive pattern may contact the first conductive pattern 300 through a contact hole. However, the number of the contact holes corresponding to the respective second conductive patterns 500 is not limited thereto. For example, each second conductive pattern may contact the first conductive pattern 300 through contact holes.

In an embodiment, each of the second conductive patterns 500 may have a rectangular shape in a plan view, and the length of a side of each of the second conductive patterns 500 may be a third length LNT3. In this case, the third length LNT3 may be greater than the length LTC of each of the contact holes CNT and may be less than the first length LNT1. For example, the third length LNT3 may be greater than about 3 μm and less than about 9 μm.

As shown in FIGS. 3, 4, and 5, the third conductive pattern 600 may be disposed on the second conductive patterns 500 and may overlap the pad area PA. The third conductive pattern 600 may directly contact the second conductive patterns 500. As shown in FIG. 6, as the second conductive patterns 500 are spaced from each other, the third conductive pattern 600 may contact the second insulating layer 420. In an embodiment, the third conductive pattern 600 may include a metal, an alloy, a conductive metal oxide, a transparent conductive material, or the like. The third conductive patterns 600 and the second conductive patterns 500 may have a same material. For example, the third conductive pattern 600 may be formed together with the second drain electrode DE2 and may have a Ti/Al/Ti structure.

The fourth conductive pattern 700 may be disposed on the third conductive pattern 600 and may overlap the pad area PA. The fourth conductive pattern 700 may directly contact the third conductive pattern 600. In an embodiment, the fourth conductive pattern 700 may include a metal, an alloy, a conductive metal oxide, a transparent conductive material, or the like. Examples of materials that can be used as the fourth conductive pattern 700 may be silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. For example, the fourth conductive pattern 700 may be formed together with the sensing electrode TPE.

The display device 1000 may include the pads PD, and each of the pads PD may include the first to fourth conductive patterns 300, 500, 600, and 700. The second conductive patterns 500 may contact the first conductive pattern 300 through the contact holes CNT, respectively.

In an embodiment, the length LTC (or an area) of each of the contact holes CNT may be significantly smaller than the first length LNT1 (or an area) of the first conductive pattern 300. In other words, each of the second conductive patterns 500 may make point contact with the first conductive pattern 300. Accordingly, a stepped region present on the upper surface of each of the second conductive patterns 500 may be minimized, and each of the pads PD may have a substantially flat upper surface. Accordingly, while the rework process is performed, the shape of the pads PD may not be deformed, and a short circuit between the pads PD may be prevented.

In an embodiment, the contact holes CNT may be arranged in the first diagonal direction DD1. Accordingly, the indentation inspection process can be easily performed. In other words, as the contact holes CNT are arranged in the first diagonal direction DD1, the pressure applied to the terminals CP, the conductive balls, and the pads PD may be easily inspected.

In an embodiment, the second conductive patterns 500 may be spaced from each other and may be arranged in an island shape. Accordingly, in a region where the second conductive patterns 500 are not disposed, the monitoring during the indentation inspection process may be easily performed.

FIGS. 7 to 12 are schematic cross-sectional views illustrating a method of manufacturing the display device of FIG. 1.

Figure 7:
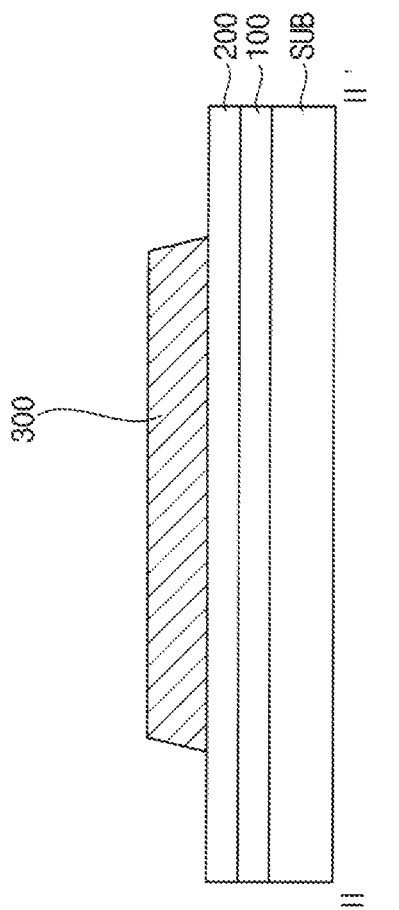
FIGS. 7 to 12 are cross-sectional views illustrating a method of manufacturing the display device of FIG. 1.
Figure 7:
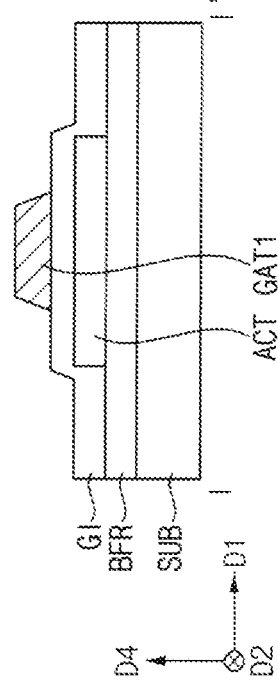

Referring to FIG. 7, the buffer layer BFR and the first lower insulating layer 100 may be formed together on the substrate SUB, and the active pattern ACT may be formed on the buffer layer BFR. The gate insulating layer GI and the second lower insulating layer 200 may be formed together, and the first gate electrode GAT1 and the first conductive pattern 300 may be formed together. For example, after a metal layer is formed on the gate insulating layer GI and the second lower insulating layer 200, the metal layer may be patterned.

Figure 8:
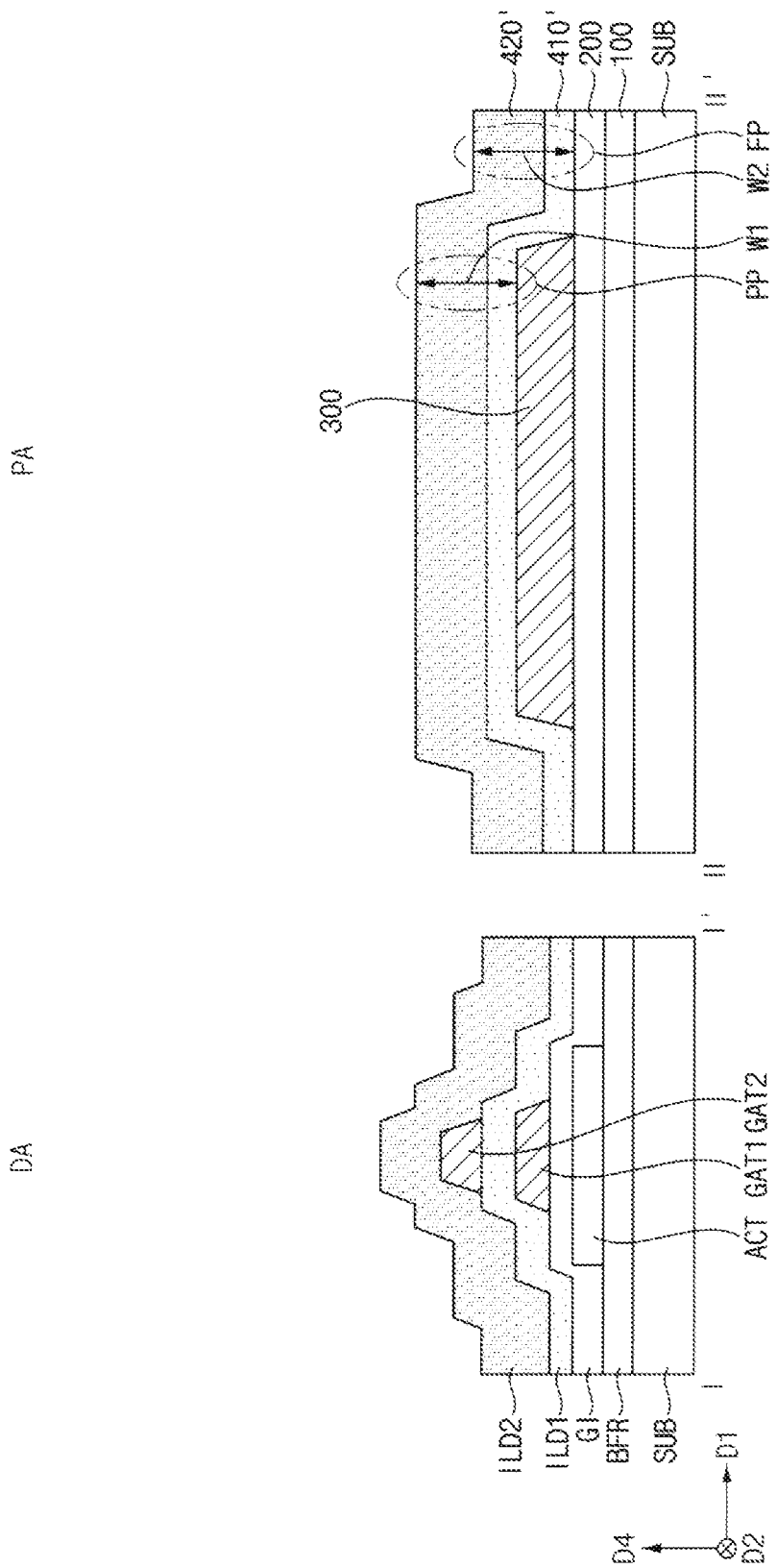

Referring to FIG. 8, the first interlayer insulating layer ILD1 and a first preliminary insulating layer 410' may be formed together, and the second gate electrode GAT2 may be formed. The first interlayer insulating layer ILD1 may cover the first gate electrode GAT1, and the first preliminary insulating layer 410' may cover the first conductive pattern 300. The second interlayer insulating layer ILD2 and a second preliminary insulating layer 420' may be formed together. The second interlayer insulating layer ILD2 may contact the first interlayer insulating layer ILD1, and the second preliminary insulating layer 420' may contact the first preliminary insulating layer 410'.

Figure 9:
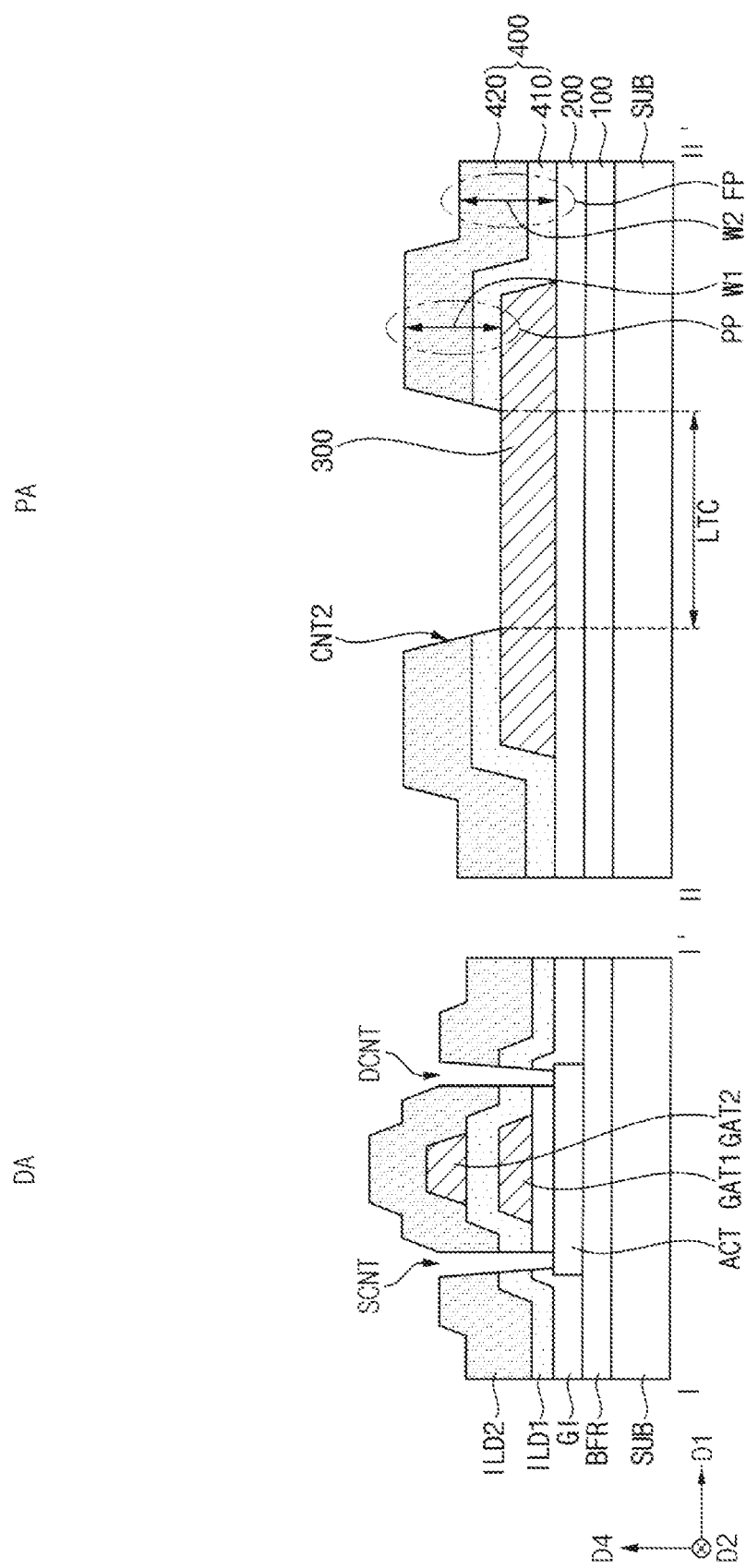

Referring to FIG. 9, a source contact hole SCNT, a drain contact hole DCNT, and the contact holes CNT may be formed together. The source contact hole SCNT and the drain contact hole DCNT may pass through the gate insulating layer GI, the first interlayer insulating layer ILD1, and the second interlayer insulating layer ILD2. The source contact hole SCNT may expose a source region of the active pattern ACT, and the drain contact hole DCNT may expose a drain region of the active pattern ACT. The contact holes CNT may pass through the first preliminary insulating layer 410' and the second preliminary insulating layer 420'. Each of the contact holes CNT may expose an upper surface of the first conductive pattern 300 by the length LTC. Accordingly, the first insulating layer 410 and the second insulating layer 420 may be formed.

Figure 10:
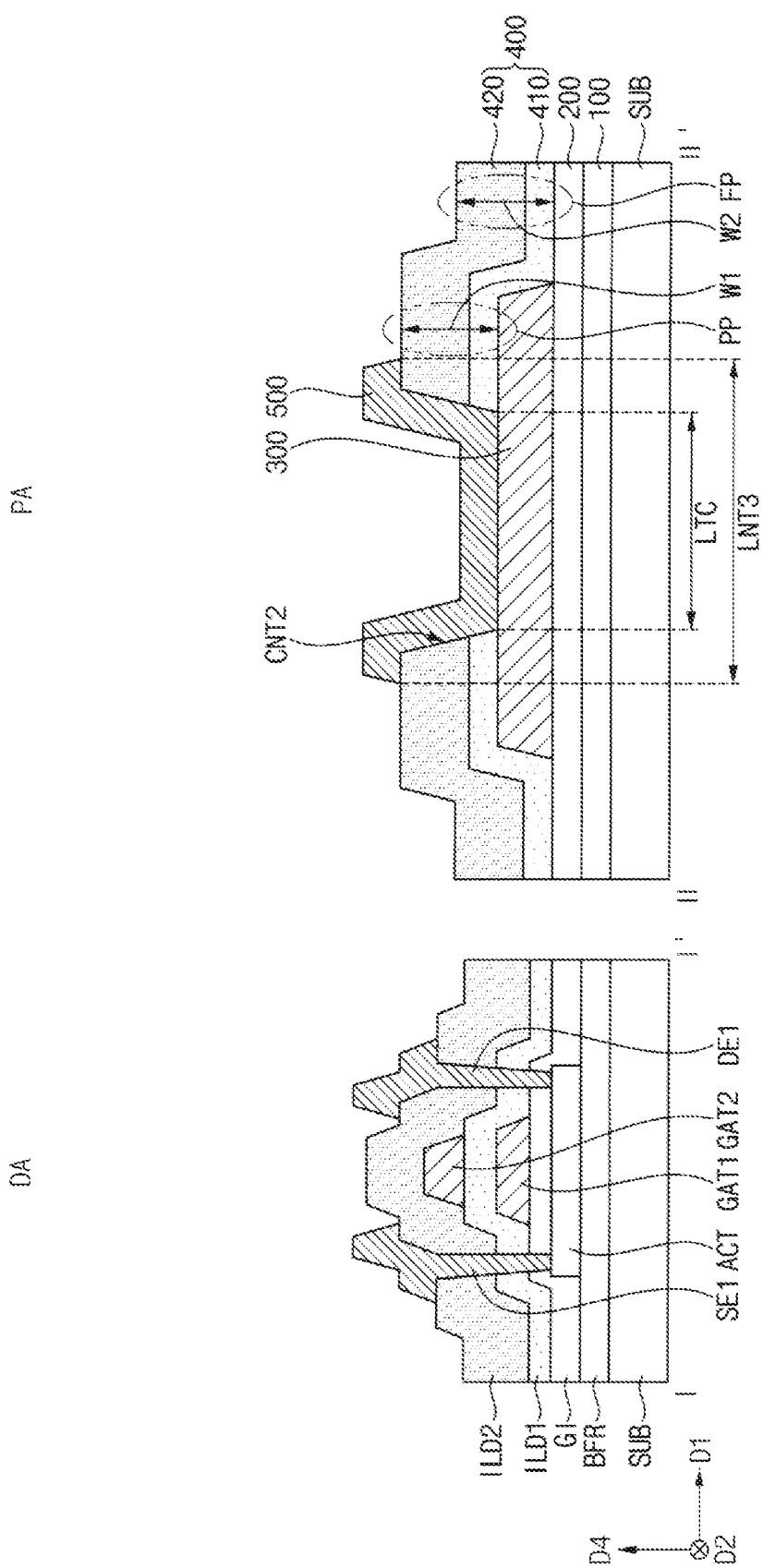

Referring to FIG. 10, the first source electrode SE1, the first drain electrode DE1, and the second conductive patterns 500 may be formed together. The first source electrode SE1 and the first drain electrode DE1 may be formed on the second interlayer insulating layer ILD2. The first source electrode SE1 may fill the source contact hole SCNT, and the first drain electrode DE1 may fill the drain contact hole DCNT. The second conductive patterns 500 may be formed on the second insulating layer 420 and may fill the contact holes CNT. Accordingly, the second conductive patterns 500 may contact the first conductive pattern 300.

Figure 11:
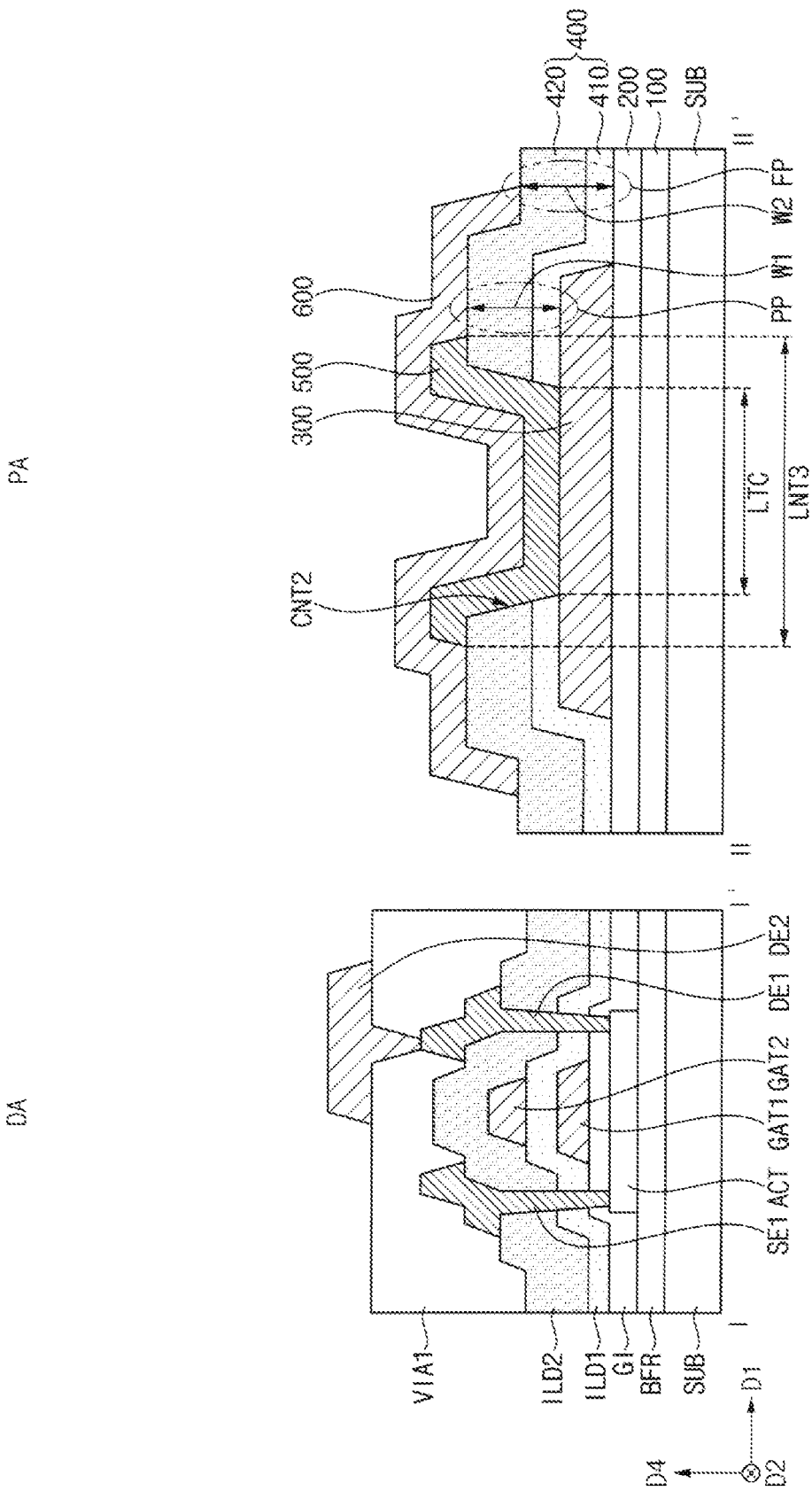

Referring to FIG. 11, the first via insulating layer VIA1 may be formed, and the second drain electrode DE2 and the third conductive pattern 600 may be formed together. The second drain electrode DE2 may contact the first drain electrode DE1, and the third conductive pattern 600 may contact the second conductive patterns 500 and the second insulating layer 420.

Figure 12:
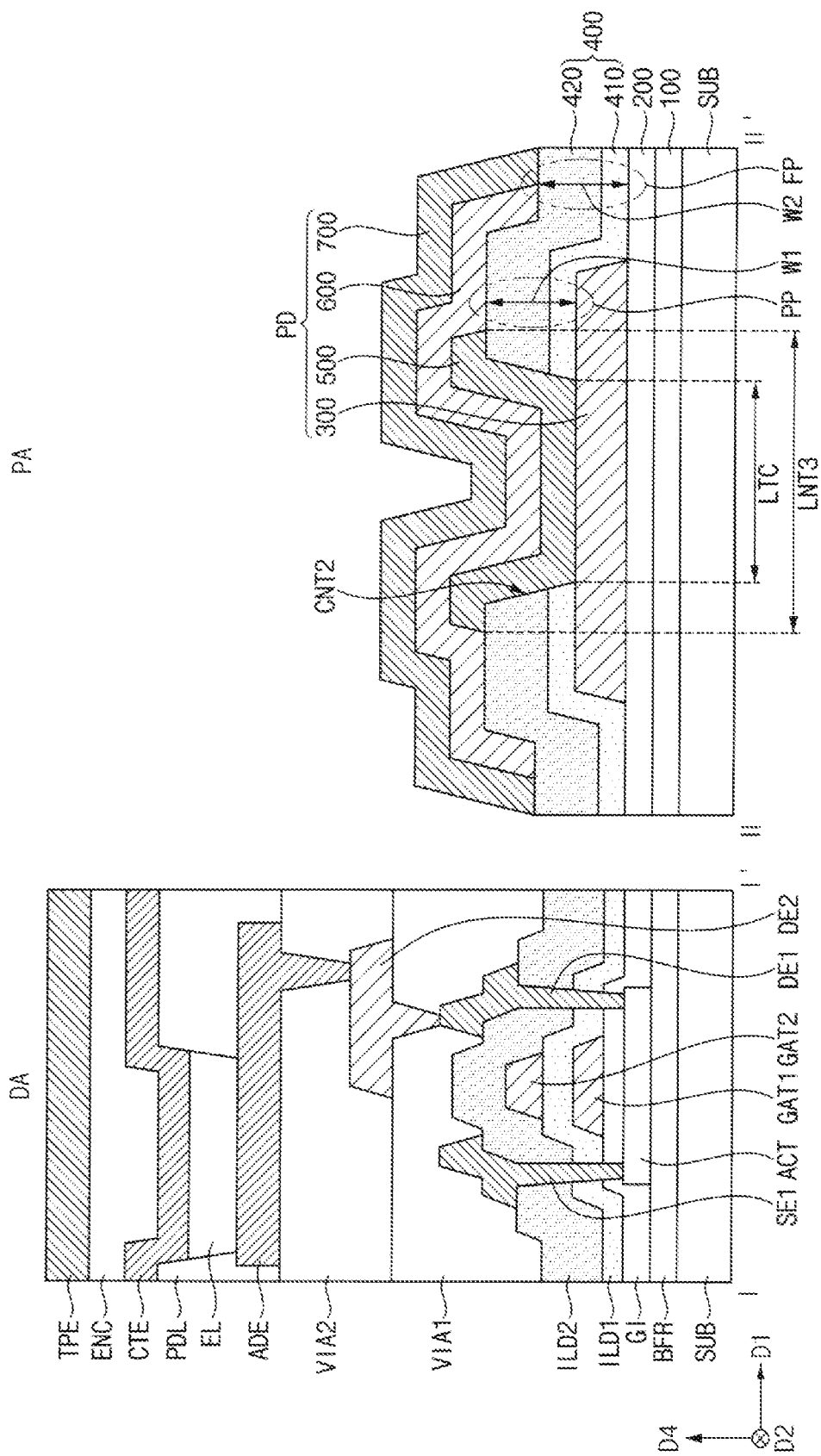

Referring to FIG. 12, the second via insulating layer VIA2, the first electrode ADE, the pixel defining layer PDL, the emission layer EL, the second electrode CTE, and the encapsulation layer ENC may be sequentially formed, and the sensing electrode TPE and the fourth conductive pattern 700 may be formed together. The fourth conductive pattern 700 may contact the third conductive pattern 600 and may have a substantially flat upper surface.

Figure 13:
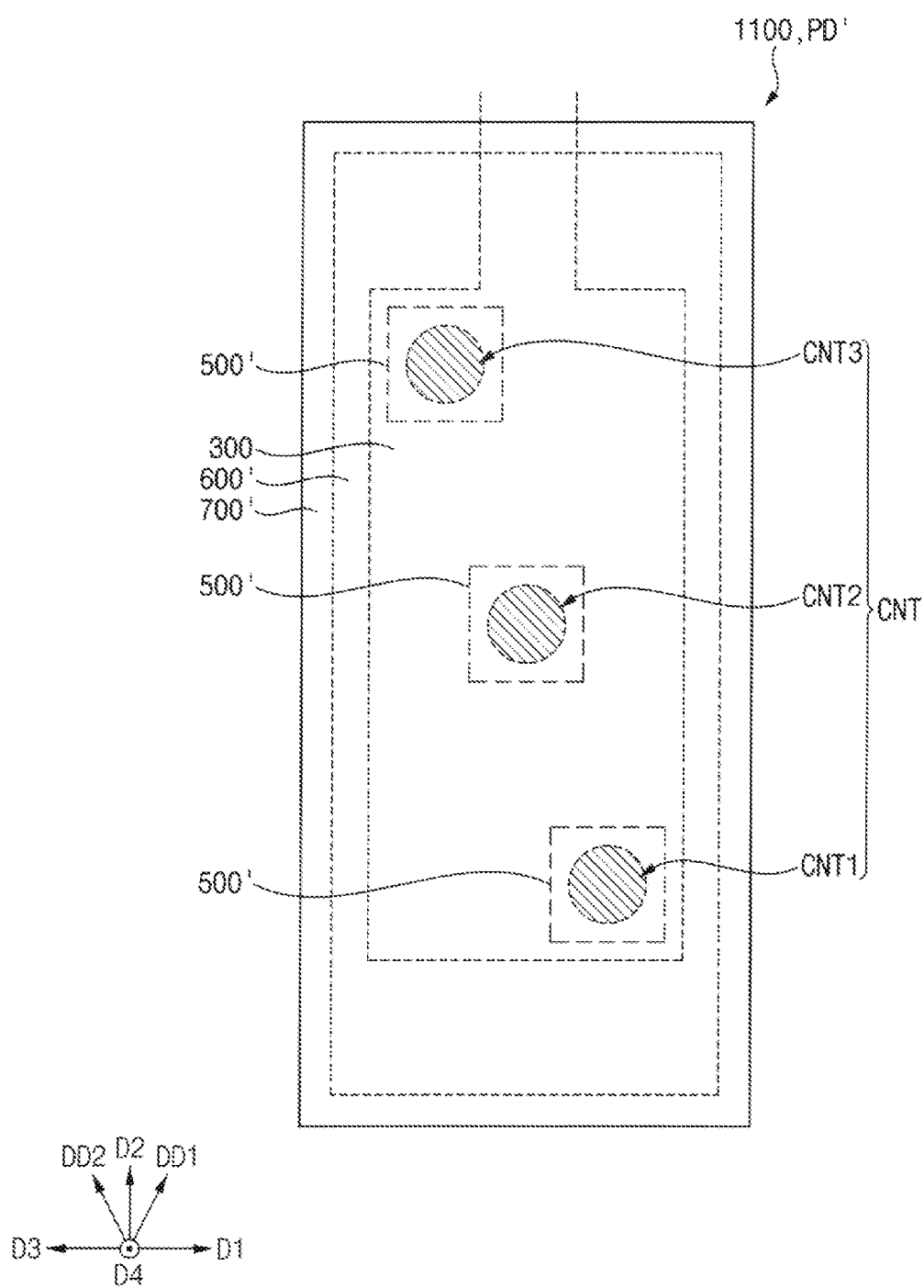
FIG. 13 is a plan view illustrating a display device according to another embodiment.

FIG. 13 is a schematic plan view illustrating a display device according to another embodiment.

Referring to FIG. 13, a display device 1100 according to another embodiment may include pads PD'. However, the display device 1100 may be substantially the same as the display device 1000 described with reference to FIGS. 1 to 3 except for the pads PD'.

The pads PD' may include the first conductive pattern 300, second conductive patterns 500', a third conductive pattern 600', and a fourth conductive pattern 700'. The first conductive pattern 300 may be substantially the same as the first conductive pattern 300 described with reference to FIGS. 3 and 4. However, as the positions at which the contact holes CNT are arranged are changed, the shapes of the second conductive patterns 500', the third conductive pattern 600', and the fourth conductive pattern 700' may be different from the shapes of the second conductive patterns 500, the third conductive pattern 600, and the fourth conductive pattern 700 described with reference to FIGS. 3 and 4.

In detail, in an embodiment, the contact holes CNT may include a first contact hole CNT1, a second contact hole CNT2, and a third contact hole CNT3. The first contact hole CNT1, the second contact hole CNT2, and the third contact hole CNT3 may be arranged in (or along) a diagonal direction of the rectangular shape RS. For example, the first contact hole CNT1, the second contact hole CNT2, and the third contact hole CNT3 may be arranged in (or along) a second diagonal direction DD2 between a third direction D3 opposite to the first direction D1 and the second directions D2.

The second conductive patterns 500' may be spaced from each other and may be disposed on the first conductive pattern 300. The second conductive patterns 500' may be arranged in (or along) the second diagonal direction DD2 of the rectangular shape RS to cover the first to third contact holes CNT1, CNT2, and CNT3, respectively. The second conductive patterns 500' may contact the first conductive pattern 300 through the first to third contact holes CNT1, CNT2, and CNT3. The third conductive pattern 600' may be disposed on the second conductive patterns 500' and may contact the second conductive patterns 500'. The fourth conductive pattern 700' may be disposed on the third conductive pattern 600' and may contact the third conductive pattern 600'.

Figure 14:
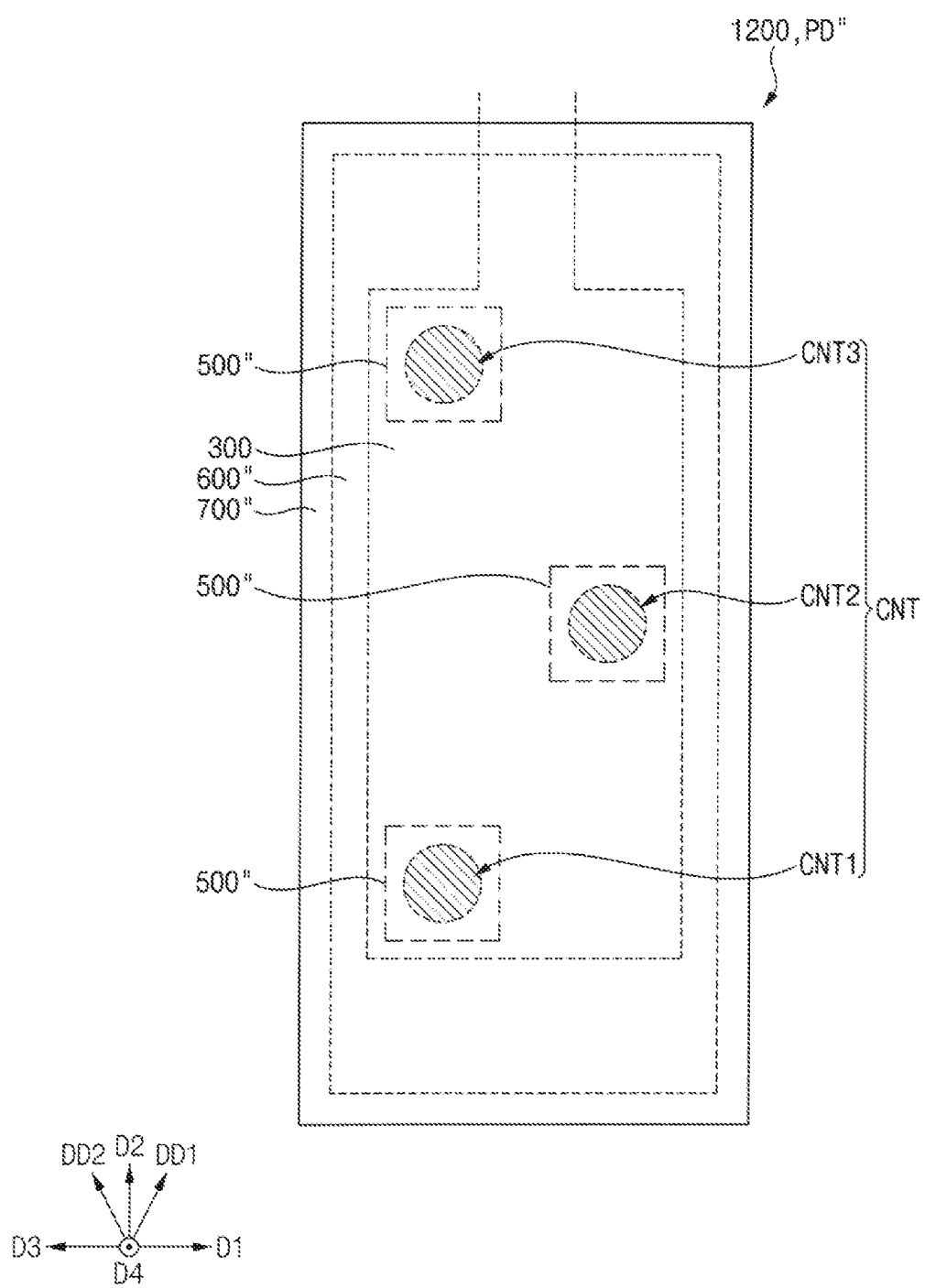
FIG. 14 is a plan view illustrating a display device according to still another embodiment.

FIG. 14 is a schematic plan view illustrating a display device according to still another embodiment.

Referring to FIG. 14, a display device 1200 according to still another embodiment may include pads PD". However, the display device 1200 may be substantially the same as the display device 1000 described with reference to FIGS. 1 to 3 except for the pads PD".

The pads PD" may include the first conductive pattern 300, second conductive patterns 500", a third conductive pattern 600", and a fourth conductive pattern 700". The first conductive pattern 300 may be substantially the same as the first conductive pattern 300 described with reference to FIGS. 3 and 4. However, as the positions at which the contact holes CNT are arranged are changed, the shapes of the second conductive patterns 500", the third conductive pattern 600", and the fourth conductive pattern 700" may be different from the shapes of the second conductive patterns 500, the third conductive pattern 600, and the fourth conductive pattern 700 described with reference to FIGS. 3 and 4.

In detail, in an embodiment, the contact holes CNT may include a first contact hole CNT1, a second contact hole CNT2, and a third contact hole CNT3. The first contact hole CNT1 and the second contact hole CNT2 may be arranged in (or along) the first diagonal direction DD1 of the rectangular shape RS, and the second contact hole CNT2 and the third contact hole CNT3 may be arranged in (or along) the second diagonal direction DD2 of the rectangular direction RS. The second diagonal direction DD2 my crosses the first diagonal direction DD1. Accordingly, the first contact hole CNT1 and the third contact hole CNT3 may be arranged side by side in the second direction D2. Accordingly, the first to third contact holes CNT1, CNT2, and CNT3 may be arranged in a triangular shape in a plan view.

The second conductive patterns 500" may be spaced from each other and may be disposed on the first conductive pattern 300. The second conductive patterns 500" may be arranged in the triangular shape to cover the first to third contact holes CNT1, CNT2, and CNT3, respectively. The second conductive patterns 500" may contact the first conductive pattern 300 through the first to third contact holes CNT1, CNT2, and CNT3. The third conductive pattern 600" may be disposed on the second conductive patterns 500" and may contact the second conductive patterns 500". The fourth conductive pattern 700" may be disposed on the third conductive pattern 600" and may contact the third conductive pattern 600".

The display device 1000, 1100, or 1200 according to embodiments may include pads PD, PD', or PD".

Each of the pads PD, PD', or PD" may include the first conductive pattern 300 and the second conductive patterns 500, 500', or 500" contacting the first conductive pattern 300 through the contact holes CNT. The length LTC (or the area) of each of the contact holes CNT may be significantly smaller than the first length LNT1 (or the area) of the first conductive pattern 300. In other words, the second conductive patterns 500, 500', or 500" may make point contact with the first conductive pattern 300. Accordingly, the stepped region present on the upper surfaces of the second conductive patterns 500, 500', or 500" may be minimized, and each of the pads PD, PD', or PD" may have a substantially flat upper surface. Therefore, while the rework process is performed, the shape of the pads PD, PD', or PD" may not be deformed, and a short circuit between the pads PD, PD', or PD" may be prevented.

The contact holes CNT may be arranged in the first diagonal direction DD1 and/or the second diagonal direction DD2. Accordingly, the indentation inspection process can be easily performed. In other words, as the contact holes CNT are arranged in the first diagonal direction DD1 and/or the second diagonal direction DD2, the pressure applied to the terminals CP, the conductive balls, and the pads PD, PD', or PD" may be easily inspected.

The second conductive patterns 500, 500', or 500" may be spaced from each other and may be arranged in the island shape. Accordingly, in a region where the second conductive patterns 500, 500', or 500" are not disposed, the monitoring during the indentation inspection process may be easily performed.

Figure 15:
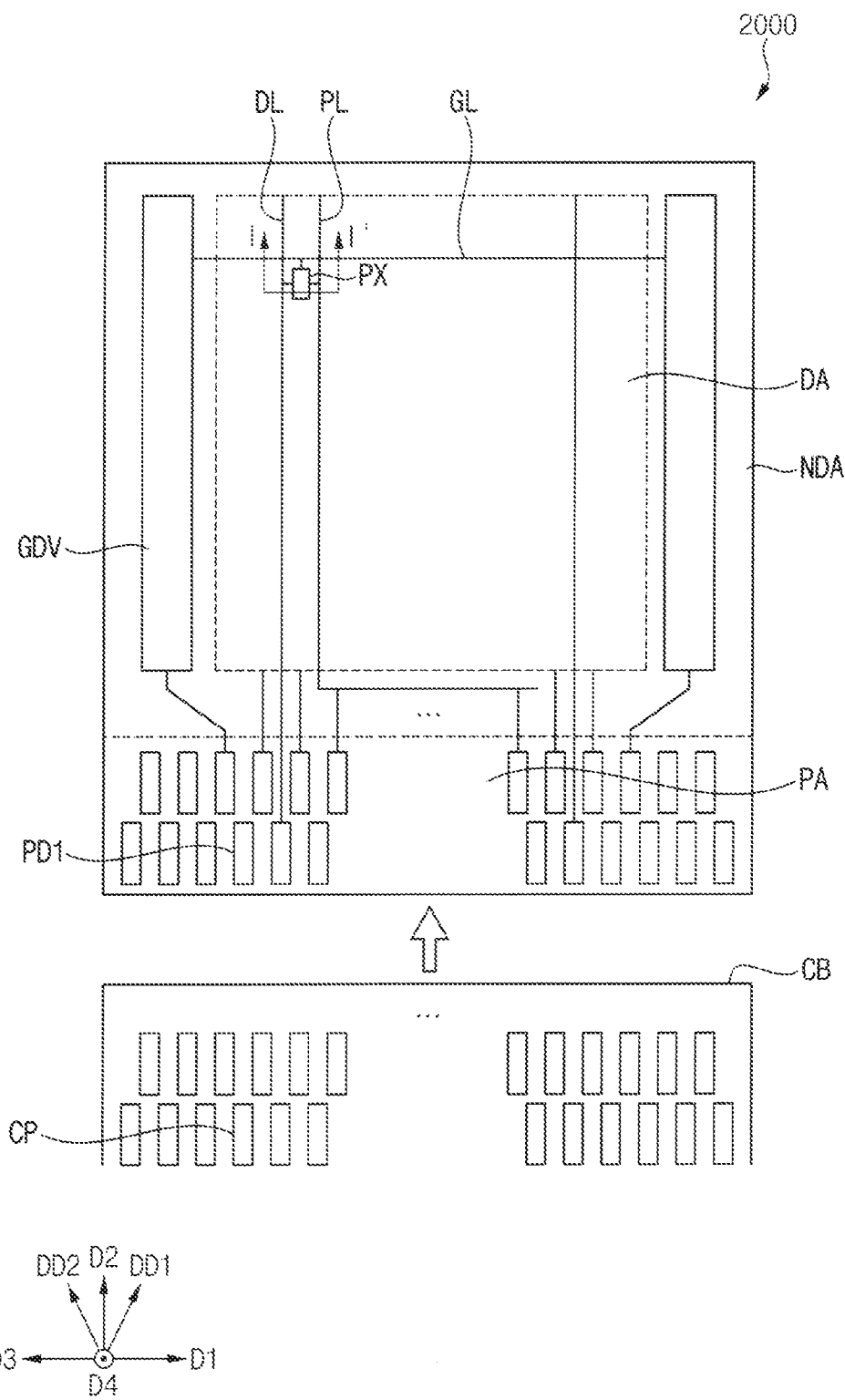
FIG. 15 is a plan view illustrating a display device according to still another embodiment.
Figure 16:
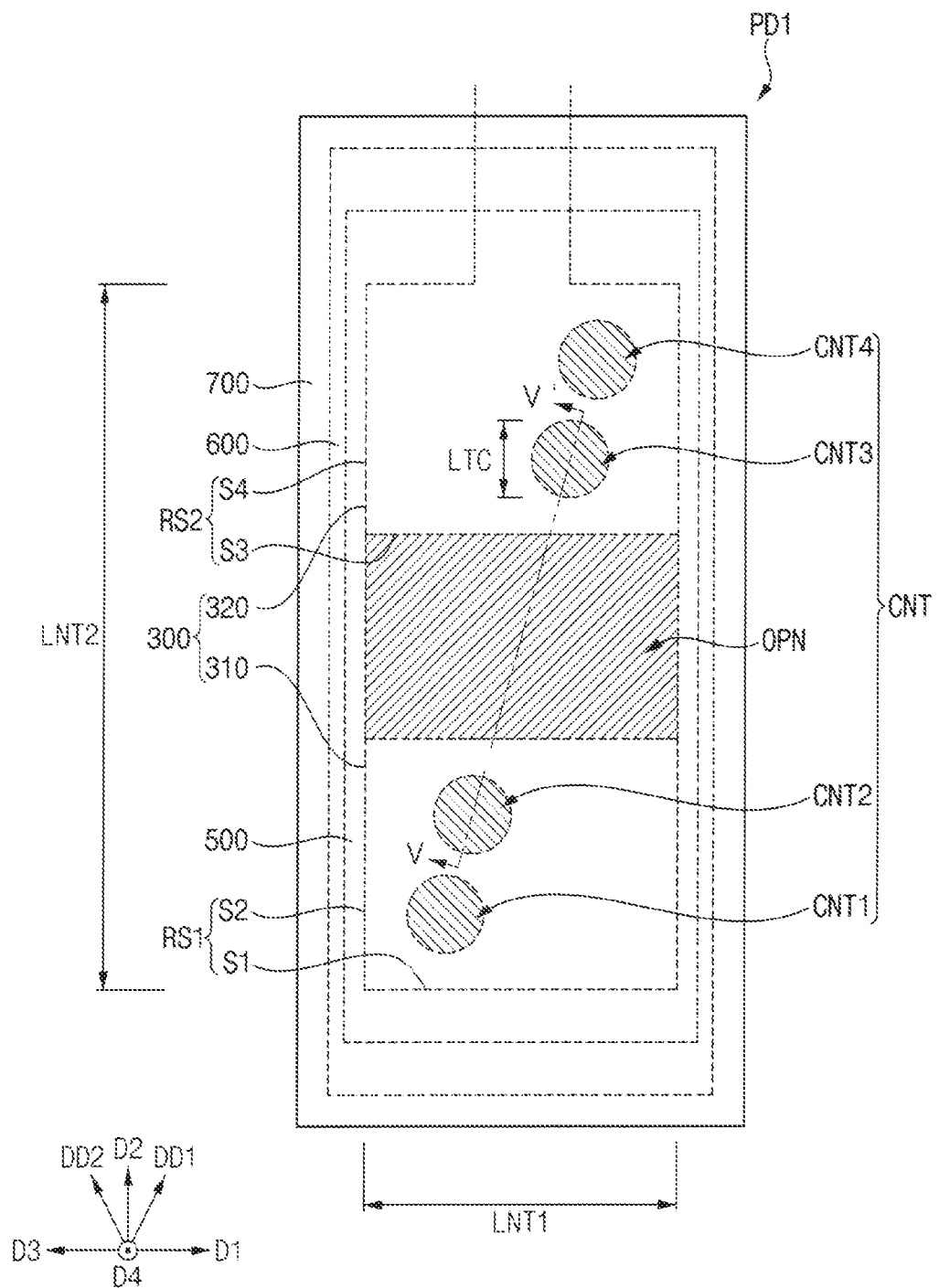
FIG. 16 is a plan view illustrating a pad included in the display device of FIG. 15.
Figure 17:
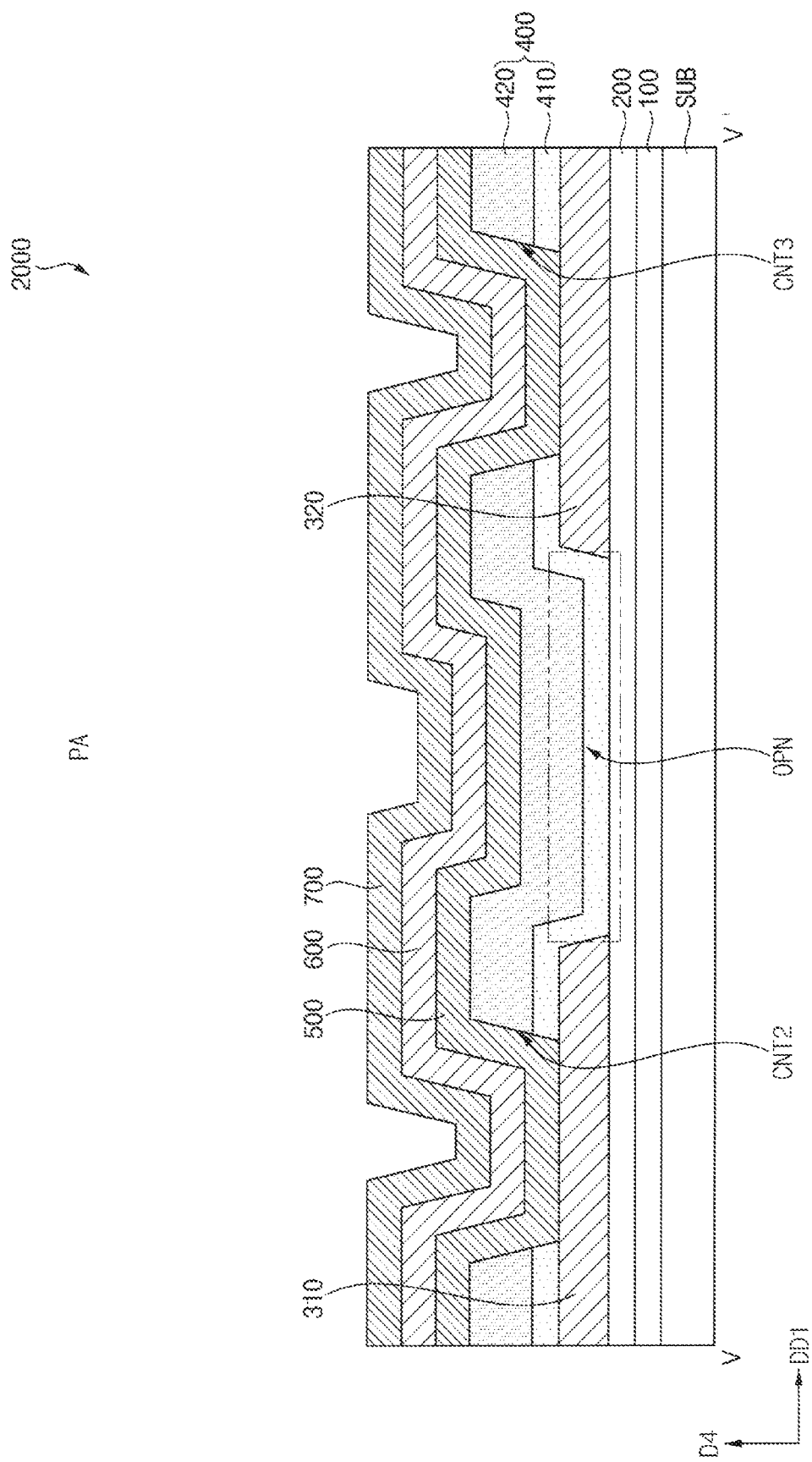
FIG. 17 is cross-sectional view illustrating the display device of FIG. 15.

FIG. 15 is a schematic plan view illustrating a display device according to still another embodiment. FIG. 16 is a schematic plan view illustrating a pad included in the display device of FIG. 15. FIG. 17 is schematic cross-sectional view illustrating the display device of FIG. 15. For example, FIG. 17 illustrates a fifth cross-sectional view taken along line V-V' of FIG. 16.

Referring to FIG. 15, a display device 2000 according to still another embodiment may be substantially the same as the display device 1000 described with reference to FIGS. 1 to 12, except for pads PD1. Hereinafter, the pads PD1 will be described in detail.

Pads PD1 may be disposed in the pad area PA of the display device 2000. For example, the pads PD1 may be arranged in (or along) the first direction D1 and may be spaced from each other in the second direction D2. However, the arrangement structure of the pads PD1 is not limited thereto.

In an embodiment, each of the pads PD1 may have a substantially same stacked structure. For example, each of the pads PD1 may have a structure in which conductive patterns are stacked each other. The conductive patterns may be formed together with the pixel PX.

As the display device 2000 according to embodiments includes the pads PD1, the monitoring during the indentation inspection process may be easily performed, and a short circuit between the pads PD1 occurring during the rework process may be prevented.

Referring to FIGS. 16 and 17, a first conductive pattern 300 may be disposed on the second lower insulating layer 200 and may overlap the pad area PA. In an embodiment, an opening OPN may be formed in the first conductive pattern 300. For example, as shown in FIG. 17, the opening OPN may penetrate the first conductive pattern 300. Accordingly, the opening OPN may expose the second lower insulating layer 200. As the opening OPN is formed in the first conductive pattern 300, the first conductive pattern 300 may include a first partial conductive pattern 310 and a second partial conductive pattern 320. In other words, the first conductive pattern 300 may include the first partial conductive pattern 310 and the second partial conductive pattern 320 which are defined by the opening OPN. The first partial conductive pattern 310 and the second partial conductive pattern 320 may be spaced from each other. The first partial conductive pattern 310 may have a first rectangular shape RS1, and the second partial conductive pattern 320 may have a second rectangular shape RS2. The first rectangular shape RS1 may include a first side S1 extending in the first direction D1 and a second side S2 extending in the second direction D2. The second rectangular shape RS2 may include a third side S3 extending in the first direction D1 and a fourth side S4 extending in the second direction D2. Lengths of the first to fourth sides S1, S2, S3, and S4 may be appropriately set as needed.

In an embodiment, the first conductive pattern 300 may include a metal, an alloy, a conductive metal oxide, a transparent conductive material, or the like. Examples of materials that can be used as the first conductive pattern 300 may be silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. For example, the first conductive pattern 300 may be formed together with the first gate electrode GAT1.

An insulating layer 400 may cover the first partial conductive pattern 310 and the second partial conductive pattern 320 and may overlap the pad area PA. The insulating layer 400 may include a first insulating layer 410 and a second insulating layer 420.

The first insulating layer 410 may cover the first partial conductive pattern 310 and the second partial conductive pattern 320 and may overlap the pad area PA. In an embodiment, the first insulating layer 410 may contact a side surface of the first partial conductive pattern 310 adjacent to the opening OPN, and a side surface of the second partial conductive pattern 320 adjacent to the opening OPN.

In an embodiment, the first insulating layer 410 may include an inorganic insulating material. Examples of materials that can be used as the first insulating layer 410 may include silicon oxide, silicon nitride, silicon oxynitride, and the like. For example, the first insulating layer 410 may be formed together with the first interlayer insulating layer ILD1.

The second insulating layer 420 may contact the first insulating layer 410 and may overlap the pad area PA. In an embodiment, the second insulating layer 420 may include an inorganic insulating material. Examples of materials that can be used as the second insulating layer 420 may include silicon oxide, silicon nitride, silicon oxynitride, and the like. For example, the second insulating layer 420 may be formed together with the second interlayer insulating layer ILD2.

In an embodiment, as shown in FIG. 16, contact holes CNT may be formed in the first insulating layer 410 and the second insulating layer 420. In other words, the contact holes CNT may penetrate the first insulating layer 410 and the second insulating layer 420. Accordingly, the contact holes CNT may expose an upper surface of the first conductive pattern 300.

In an embodiment, the contact holes CNT may include a first contact hole CNT1, a second contact hole CNT2, a third contact hole CNT3, and a fourth contact hole CNT4. The first and second contact holes CNT1 and CNT2 may expose an upper surface of the first partial conductive pattern 310, and the third and fourth contact holes CNT3 and CNT4 may expose an upper surface of the second partial conductive pattern 320.

In an embodiment, the first contact hole CNT1, the second contact hole CNT2, the third contact hole CNT3, and the fourth contact hole CNT4 may be arranged in (or along) the first diagonal direction DD1. For example, the first contact hole CNT1 and the second contact hole CNT2 may be arranged in (or along) a diagonal direction of the first rectangular shape RS1, and the third contact hole CNT3 and the fourth contact hole CNT4 may be arranged in (or along) a diagonal direction of the second rectangular shape RS2.

A second conductive pattern 500 may be disposed on the second insulating layer 420 and may overlap the pad area PA. In an embodiment, the second conductive pattern 500 may include a metal, an alloy, a conductive metal oxide, a transparent conductive material, or the like. The second conductive pattern 500 and the first conductive pattern 300 may include different materials. For example, the second conductive pattern 500 may be formed together with the first source electrode SE1 and may have a Ti/Al/Ti structure.

A third conductive pattern 600 may be disposed on the second conductive pattern 500 and may overlap the pad area PA. The third conductive pattern 600 may directly contact the second conductive pattern 500. In an embodiment, the third conductive pattern 600 may include a metal, an alloy, a conductive metal oxide, a transparent conductive material, or the like. The third conductive pattern 600 and the second conductive pattern 500 may include a same material. For example, the third conductive pattern 600 may be formed together with the second drain electrode DE2 and may have a Ti/Al/Ti structure.

The fourth conductive pattern 700 may be disposed on the third conductive pattern 600 and may overlap the pad area PA. The fourth conductive pattern 700 may directly contact the third conductive pattern 600. In an embodiment, the fourth conductive pattern 700 may include a metal, an alloy, a conductive metal oxide, a transparent conductive material, or the like. Examples of materials that can be used as the fourth conductive pattern 700 may be silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. For example, the fourth conductive pattern 700 may be formed together with the sensing electrode TPE.

The display device 2000 may include the pads PD1, and each of the pads PD1 may include the first to fourth conductive patterns 300, 500, 600, and 700. The second conductive pattern 500 may contact the first partial conductive pattern 310 and the second partial conductive pattern 320 through the contact holes CNT.

In an embodiment, the length LTC (or the area) of each of the contact holes CNT may be significantly smaller than the first length LNT1 (or the area) of the first conductive pattern 300. In other words, the second conductive pattern 500 may make point contact with the first partial conductive pattern 310 and the second partial conductive pattern 320. Accordingly, a stepped region present on the upper surface of the second conductive pattern 500 may be minimized, and each of the pads PD1 may have a substantially flat upper surface. Accordingly, while the rework process is being performed, the shape of the pads PD1 may not be deformed, and a short circuit between the pads PD1 may be prevented.

In an embodiment, the contact holes CNT may be arranged in the first diagonal direction DD1. Accordingly, the indentation inspection process can be easily performed. In other words, as the contact holes CNT are arranged in the first diagonal direction DD1, the pressure applied to the terminals CP, the conductive balls, and the pads PD1 may be easily inspected.

In an embodiment, the opening OPN may be formed in the first conductive pattern 300. Accordingly, in a region through which the first conductive pattern 300 passes, the monitoring during the indentation inspection process may be easily performed.

Figure 18:
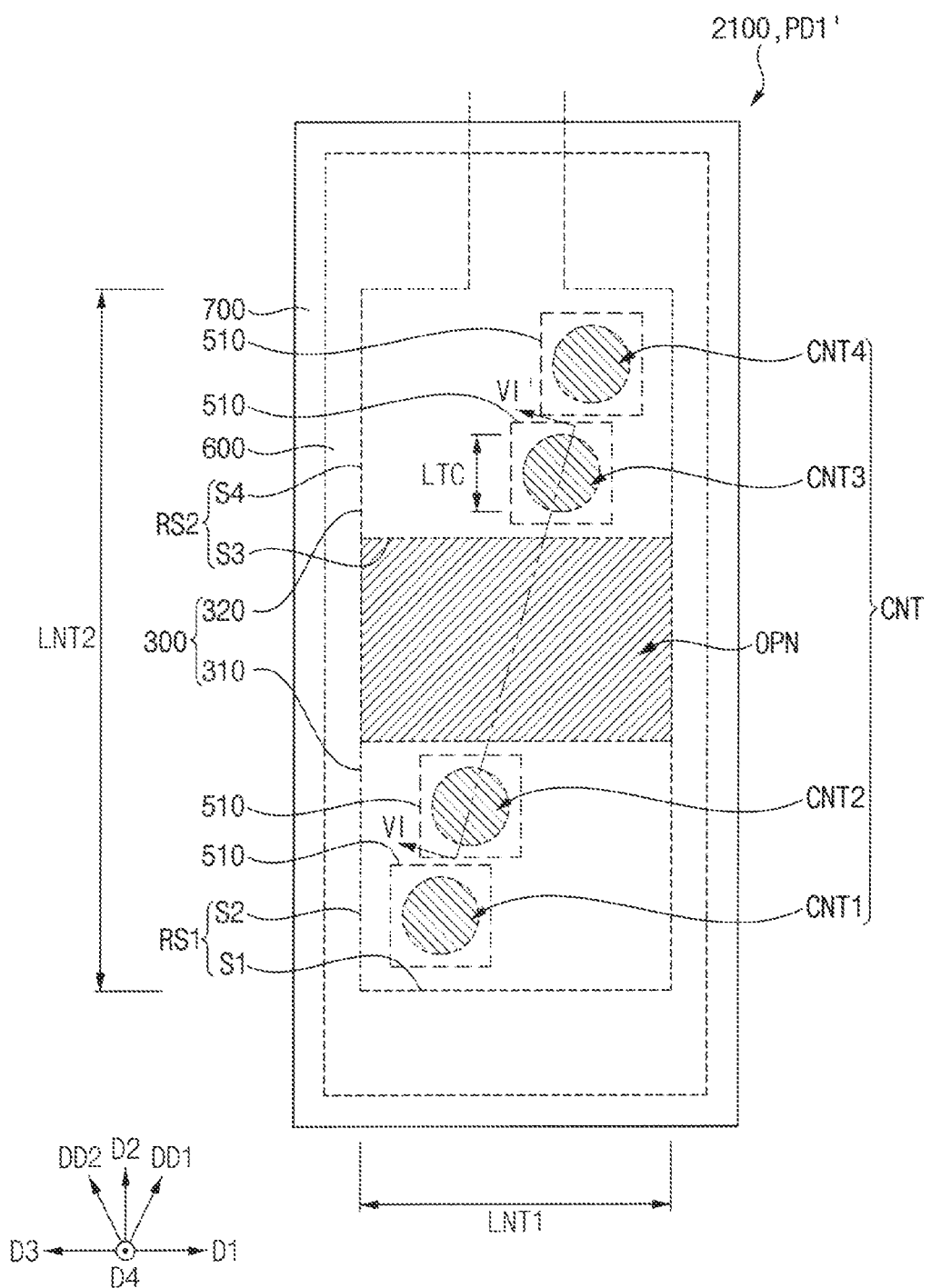
FIG. 18 is a plan view illustrating a display device according to still another embodiment.
Figure 19:
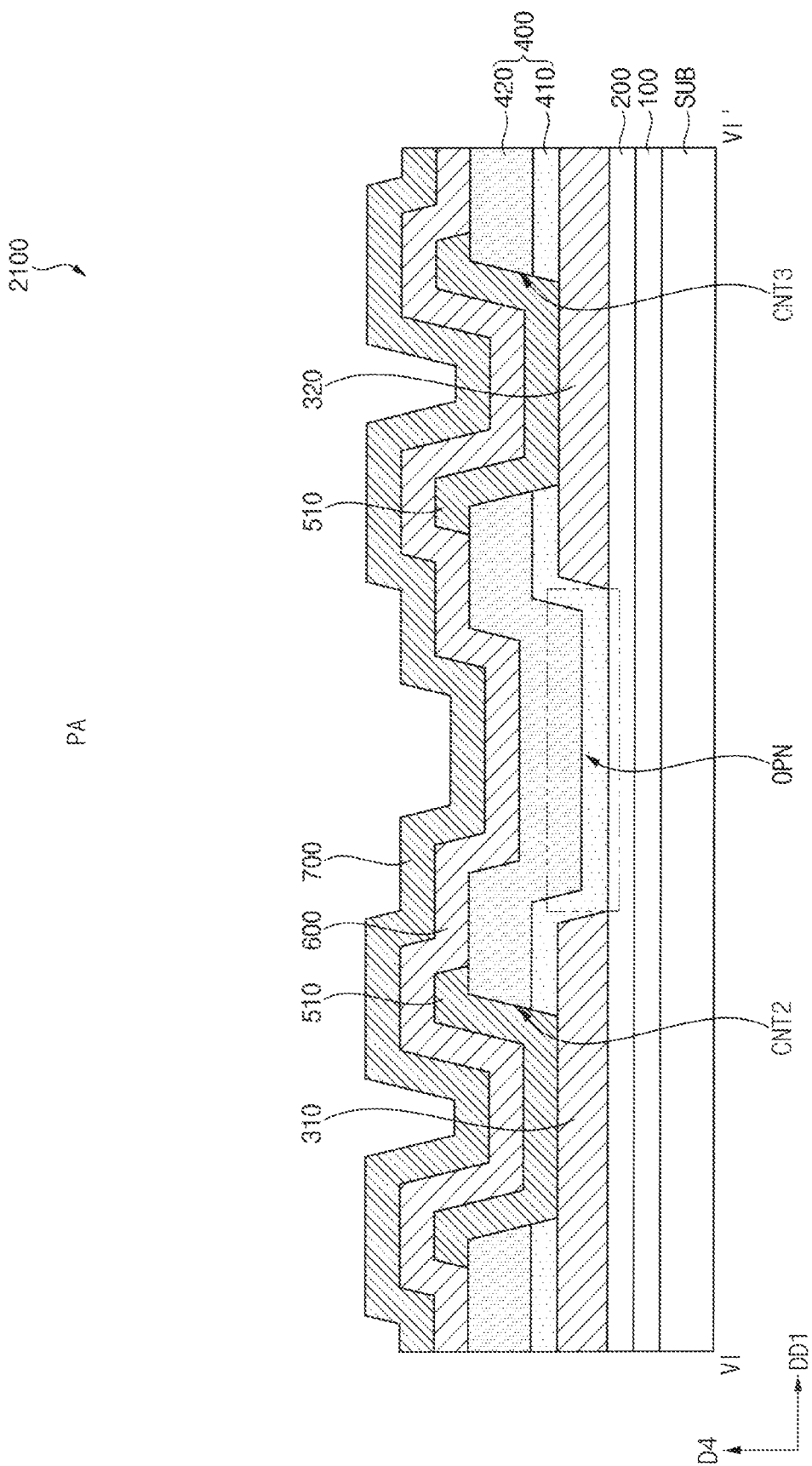
FIG. 19 is cross-sectional view illustrating the display device of FIG. 18.

FIG. 18 is a schematic plan view illustrating a display device according to still another embodiment. FIG. 19 is schematic cross-sectional view illustrating the display device of FIG. 18. FIG. 19 illustrates a schematic cross-sectional view taken along line VI-VI' of FIG. 18.

Referring to FIGS. 18 and 19, a display device 2100 according to still another embodiment may include pads PD1'. However, the display device 2100 may be substantially the same as the display device 2000 described with reference to FIGS. 15 to 17, except for the pads PD1'.

The pads PD1' may include the first conductive pattern 300, second conductive patterns 510, a third conductive pattern 600, and a fourth conductive pattern 700. The first conductive pattern 300 may include the first partial conductive pattern 310 and the second partial conductive pattern 320. The first partial conductive pattern 310 and the second partial conductive pattern 320 may be substantially the same as the first partial conductive pattern 310 and the second partial conductive pattern 320 described with reference to FIGS. 16 and 17. In other words, the opening OPN may be formed in the first conductive pattern 300.

In an embodiment, the second conductive patterns 510 may be spaced from each other. For example, the second conductive patterns 510 may be arranged in an island shape. The second conductive patterns 510 may be arranged in the first diagonal direction DD1 to cover the first to fourth contact holes CNT1, CNT2, CNT3, and CNT4, respectively. However, the position where the second conductive patterns 510 are arranged is not limited thereto.

Figure 20:
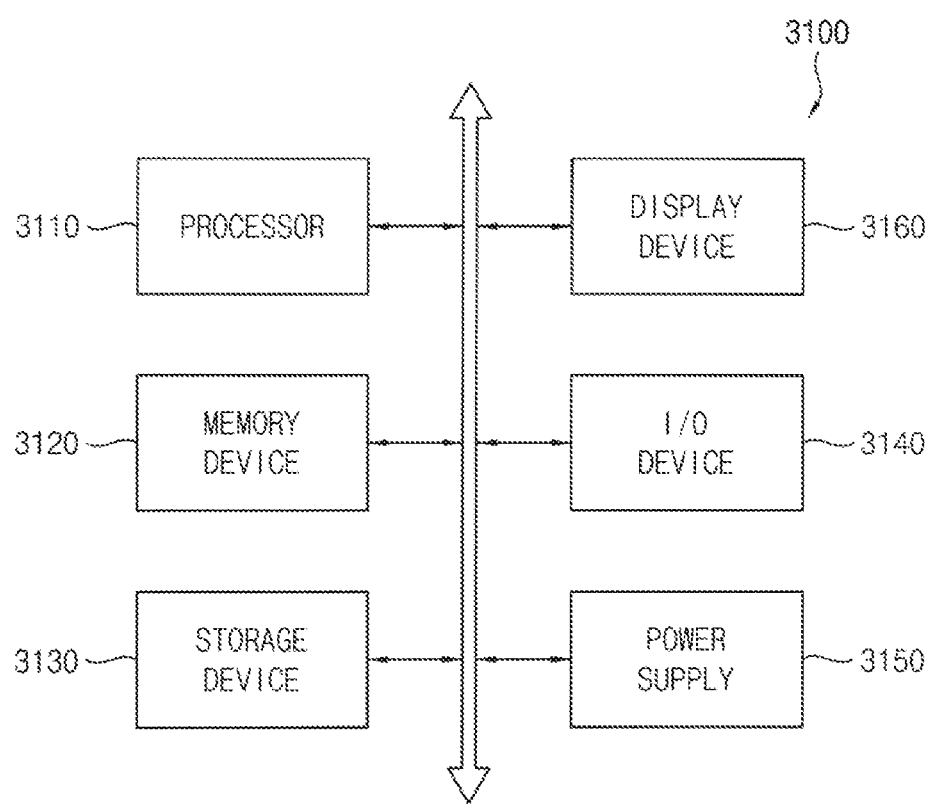
FIG. 20 is a block diagram illustrating an electronic device including the display device according to embodiments.

FIG. 20 is a schematic block diagram illustrating an electronic device including the display device of FIG. 1.

Referring to FIG. 20, an electronic device 3100 may include a processor 3110, a memory device 3120, a storage device 3130, an input/output (I/O) device 3140, a power supply 3150, and a display device 3160.

The electronic device 3100 may further include various ports capable of communicating with a video card, a sound card, a memory card, a universal serial bus (USB) device, or the like, or communicating with other systems.

The processor 3110 may perform various computing functions. In an embodiment, the processor 3110 may be a microprocessor, a central processing unit (CPU), an application processor (AP), or the like. The processor 3110 may be electrically connected to other components via an address bus, a control bus, a data bus, or the like. In an embodiment, the processor 3110 may be electrically connected to an extended bus such as a peripheral component interface (PCI) bus.

The memory device 3120 may store data for operations of the electronic device 3100. In an embodiment, the memory device 3120 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, or the like, and/or at least one volatile memory device such as a dynamic random access memory (DRAM) device, a static random access memory (SRAM) device, a mobile DRAM device, or the like.

The storage device 3130 may include a solid-state drive (SSD) device, a hard disk drive (HDD) device, a compact disc read-only memory (CD-ROM) device, or the like. The I/O device 3140 may include an input device such as a keyboard, a keypad, a mouse device, a touchpad, a touchscreen, or the like, and an output device such as a printer, a speaker, or the like. The power supply 3150 may provide power for operations of the electronic device 3100. The display device 3160 may be electrically connected to other components via the buses or other communication links.

The electronic device 3100 may be any electronic device including the display device 3160 such as a mobile phone, a smartphone, a tablet computer, a digital television (TV), a 3D TV, a personal computer (PC), a home appliance, a laptop computer, personal digital assistant (PDA), a portable multimedia player (PMP), a digital camera, a music player, a portable game console, a navigation system, and the like.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate including a pad area;
a first conductive pattern disposed in the pad area on the substrate;
an insulating layer disposed on the first conductive pattern and overlapping the first conductive pattern;
second conductive patterns disposed on the insulating layer, spaced apart from each other, and each comprising a planar bottom surface directly contacting the first conductive pattern through a contact hole formed in the insulating layer, the planar bottom surface extending from a first end of the insulating layer directly contacting a first edge of the first conductive pattern to a second end of the insulating layer directly contacting a second edge of the first conductive pattern; and
a third conductive pattern disposed on the second conductive patterns and contacting the insulating layer.

2. The display device of claim 1, wherein each of the second conductive patterns has an isolated shape.

3. The display device of claim 1, wherein
the first conductive pattern has a rectangular shape in a plan view, and
the second conductive patterns are arranged in a diagonal direction of the rectangular shape.

4. The display device of claim 3, wherein the contact hole is arranged in the diagonal direction of the rectangular shape.

5. The display device of claim 1, wherein the third conductive pattern contacts the second conductive patterns.

6. The display device of claim 1, wherein the second conductive patterns and the third conductive pattern include a same material.

7. The display device of claim 6, wherein each of the second conductive patterns and the third conductive pattern has a structure including titanium, aluminum, and titanium disposed in sequence.

8. The display device of claim 1, wherein the second conductive patterns and the first conductive pattern include a different material.

9. The display device of claim 8, wherein the first conductive pattern includes molybdenum.

10. The display device of claim 1, wherein the insulating layer includes:
an overlap portion surrounding each contact hole and overlapping the first conductive pattern; and
a non-overlap portion having an upper surface lower than an upper surface of the overlap portion in a thickness direction of the display device.

11. The display device of claim 10, wherein a thickness of the overlap portion is a same as a thickness of the non-overlap portion.

12. The display device of claim 10, wherein a thickness of each of the overlap portion and the non-overlap portion is about 6,000 angstroms to about 7,000 angstroms.

13. The display device of claim 1, further comprising:
a fourth conductive pattern disposed on the third conductive pattern and directly contacting the third conductive pattern;
the first, second, third, and fourth conductive patterns forming a pad in the pad area.

14. A display device comprising:
a substrate including a pad area;
a first conductive pattern disposed in the pad area on the substrate;
an insulating layer disposed on the first conductive pattern and overlapping the first conductive pattern;
second conductive patterns disposed on the insulating layer, spaced apart from each other, and contacting the first conductive pattern through contact holes formed in the insulating layer;
a third conductive pattern disposed on the second conductive patterns and contacting the insulating layer,
an active pattern disposed in a display area adjacent to the pad area on the substrate;
a gate electrode overlapping the active pattern, the gate electrode and the first conductive pattern being disposed in a same layer;
a first connection electrode contacting the active pattern, the first connection electrode and the second conductive patterns being disposed in a same layer;
a second connection electrode contacting the first connection electrode, the second connection electrode and the third conductive pattern being disposed in a same layer;
a first electrode disposed on the second connection electrode and contacting the second connection electrode;
an emission layer disposed on the first electrode; and
a second electrode disposed on the emission layer.

15. A display device comprising:
a substrate including a pad area;
a first conductive pattern disposed in the pad area on the substrate and including a first partial conductive pattern and a second partial conductive pattern which are defined by an opening extending completely through the first conductive pattern;
an insulating layer disposed on the first conductive pattern and extending into the opening and directly contacting a side surface of the first partial conductive pattern adjacent to the opening and a side surface of the second partial conductive pattern adjacent to the opening; and
a second conductive pattern disposed on the insulating layer and contacting the first conductive pattern through contact holes which are formed in the insulating layer.

16. The display device of claim 15, wherein the first partial conductive pattern and the second partial conductive pattern is spaced apart from each other by the opening.

17. The display device of claim 15, wherein
each of the first partial conductive pattern and the second partial conductive pattern has a rectangular shape in a plan view, and
the contact holes are arranged in a diagonal direction of the rectangular shape.

18. The display device of claim 1, wherein the planar bottom surface extends completely from the first end of the insulating layer to the second end of the insulating layer.

* * * * *